United States Patent
Zhang et al.

(10) Patent No.: US 12,495,665 B2
(45) Date of Patent: Dec. 9, 2025

(54) DISPLAY DEVICE HAVING CARRIER BLOCKING SECTION BETWEEN PIXELS

(71) Applicant: SHARP KABUSHIKI KAISHA, Sakai (JP)

(72) Inventors: Bai Zhang, Sakai (JP); Koji Yasukawa, Sakai (JP); Tokiyoshi Umeda, Sakai (JP); Naoki Uetake, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 427 days.

(21) Appl. No.: 18/022,128

(22) PCT Filed: Aug. 19, 2020

(86) PCT No.: PCT/JP2020/031202
§ 371 (c)(1),
(2) Date: Feb. 17, 2023

(87) PCT Pub. No.: WO2022/038694
PCT Pub. Date: Feb. 24, 2022

(65) Prior Publication Data
US 2023/0309334 A1    Sep. 28, 2023

(51) Int. Cl.
*H10K 50/15*    (2023.01)
*H10K 59/12*    (2023.01)
(Continued)

(52) U.S. Cl.
CPC ......... *H10K 50/15* (2023.02); *H10K 59/1201* (2023.02); *H10K 50/16* (2023.02);
(Continued)

(58) Field of Classification Search
CPC .. H10K 50/15; H10K 59/1201; H10K 50/181; H10K 59/35; H10K 50/16; H10K 59/12
See application file for complete search history.

(56) References Cited

U.S. PATENT DOCUMENTS

2017/0186971 A1* 6/2017 Kanamoto ......... C07D 491/048
2018/0090546 A1  3/2018 Hashimoto
(Continued)

FOREIGN PATENT DOCUMENTS

JP  2003142277 A  5/2003
JP  2015002125 A  1/2015
(Continued)

OTHER PUBLICATIONS

Sung Huh et al., "UV/Ozone-Oxidized Large-Scale Graphene Platform with Large Chemical Enhancement in Surface-Enhanced Raman Scattering" American Chemical Society, ACS Nano, vol. 5 (12), pp. 9799-9806, Nov. 9, 2011.
(Continued)

*Primary Examiner* — Michael Jung
(74) *Attorney, Agent, or Firm* — ScienBiziP, P.C.

(57) ABSTRACT

A display device includes a hole transport layer common to a plurality of light-emitting elements between a light-emitting layer and an anode electrode below thereof in the light-emitting element in each pixel. The hole transport layer includes a hole transport section that transports positive holes to the light-emitting layer, and an adjacent pixel hole blocking section that is formed in a portion between the light-emitting elements in adjacent pixels and blocks transportation of positive holes between the light-emitting elements in adjacent pixels.

17 Claims, 23 Drawing Sheets

(51) Int. Cl.
　　　*H10K 50/16*　　　(2023.01)
　　　*H10K 50/18*　　　(2023.01)
　　　*H10K 59/35*　　　(2023.01)

(52) U.S. Cl.
　　　CPC ........... *H10K 50/181* (2023.02); *H10K 59/12* (2023.02); *H10K 59/35* (2023.02)

(56) References Cited

U.S. PATENT DOCUMENTS

| | | | |
|---|---|---|---|
| 2019/0157595 A1 | 5/2019 | Seo et al. | |
| 2019/0363138 A1 | 11/2019 | Jo et al. | |
| 2020/0035941 A1* | 1/2020 | Yoo | H10K 50/11 |
| 2021/0005669 A1* | 1/2021 | Kamada | H10K 65/00 |
| 2022/0278177 A1* | 9/2022 | Kubota | H10K 59/65 |

FOREIGN PATENT DOCUMENTS

| | | |
|---|---|---|
| JP | 2018055936 A | 4/2018 |
| JP | 2019096603 A | 6/2019 |
| WO | 2018179116 A1 | 10/2018 |

OTHER PUBLICATIONS

Sasha Stankovich et al., "Synthesis of graphene-based nanosheets via chemical reduction of exfoliated graphite oxide", Carbon, vol. 45 (2007), pp. 1558-1565, Mar. 7, 2007.

Yonglai Zhang et al., "Direct imprinting of microcircuits on graphene oxides film by femtosecond laser reduction", Nano Today, vol. 5 (2010), pp. 15-20, Jan. 2010.

* cited by examiner

DISPLAY DEVICE HAVING CARRIER BLOCKING SECTION BETWEEN PIXELS

TECHNICAL FIELD

The disclosure relates to a display device and a manufacturing method thereof.

BACKGROUND ART

Hitherto, in manufacturing a self-luminous display device including light-emitting elements, a method of forming a hole transport layer or an electron transport layer as a common layer common to a plurality of pixels is used (see, for example, PTL 1).

CITATION LIST

Patent Literature

PTL 1: JP 2003-142277 A

Non Patent Literature

NPL 1: Sung Huh and other five authors, "UV/Ozone-Oxidized Large-Scale Graphene Platform with Large Chemical Enhancement in Surface-Enhanced Raman Scattering", *American Chemical Society*, ACS Nano, Volume 5 (12), Pages 9799-9806, 9 Nov. 2011

NPL 2: Sasha Stankovich, and other eight authors, "Synthesis of graphene-based nanosheets via chemical reduction of exfoliated graphite oxide", *Carbon*, Volume 45 (7), Pages 1558-1565, 7 Jun. 2007

NPL 3: Yonglai Zhang, and other eight authors, "Direct imprinting of microcircuits on graphene oxides film by femtosecond laser reduction", *Nano Today*, Volume 5 (1), Pages 15-20, February 2010

SUMMARY

Technical Problem

As described above, by forming the hole transport layer or the electron transport layer as the common layer common to the plurality of pixels, for example, the number of manufacturing steps can be reduced, thereby reducing the manufacturing costs.

In addition, by forming the hole transport layer or the electron transport layer as the common layer common to the plurality of pixels, foreign matters such as water or oxygen can be prevented from penetrating from the outside, resulting in a more reliable display device.

However, in a case in which the hole transport layer or the electron transport layer is formed as the common layer common to the plurality of pixels, when one pixel (light-emitting element) emits light, carriers are also transported to a light-emitting layer of an adjacent pixel (light-emitting element) via the common layer, thereby causing optical crosstalk in which the adjacent light-emitting element also emits light. Such crosstalk causes deterioration in display quality of the display device.

The disclosure has been made in view of the problems described above, and an object of the disclosure is to provide a self-luminous display device in which crosstalk does not occur and a manufacturing method thereof, regardless of including a common layer formed in common for a plurality of pixels, through which carriers are transported.

Solution to Problem

In order to solve the above problems, a display device according to one aspect of the disclosure is a display device having a plurality of pixels. The display device includes a support body, a thin film transistor layer, a light-emitting element layer, and a sealing layer configured to seal the light-emitting element layer in this order, in which the light-emitting element layer includes a plurality of light-emitting elements having different luminescent colors from each other, the plurality of light-emitting elements are formed corresponding to the plurality of pixels, respectively, each of the plurality of light-emitting elements includes a lower electrode, an upper electrode, and a light-emitting layer formed between the lower electrode and the upper electrode, and also includes, of a first carrier transport layer formed between the light-emitting layer and the lower electrode and a second carrier transport layer formed between the light-emitting layer and the upper electrode, at least the first carrier transport layer, the lower electrode and the light-emitting layer are formed in island shapes for each of the plurality of pixels, and at least the first carrier transport layer of the two carrier transport layers included in the light-emitting element is a common layer formed in common to the plurality of light-emitting elements in the plurality of pixels, and includes, for each of the plurality of pixels, a carrier transport section formed overlapping the light-emitting layer in each of the plurality of light-emitting elements and configured to transport carriers to the light-emitting layer, and an adjacent pixel carrier blocking section formed in a portion between the plurality of light-emitting elements in the plurality of pixels adjacent to each other and configured to block transportation of carriers between the plurality of light-emitting elements in the plurality of pixels adjacent to each other.

To solve the above problems, a manufacturing method of a display device according to one aspect of the disclosure is a manufacturing method of the display device described above, and includes forming the lower electrode, forming the first carrier transport layer, forming the light-emitting layer, and forming the upper electrode.

Advantageous Effects of Disclosure

According to one aspect of the disclosure, it is possible to provide a self-luminous display device in which crosstalk does not occur and a manufacturing method thereof, regardless of including a common layer formed in common for a plurality of pixels, through which carriers are transported.

DESCRIPTION OF EMBODIMENTS

First Embodiment

One aspect of the disclosure will be described below with reference to FIGS. 1 to 13.

Schematic Configuration of Display Device

Figure 2:
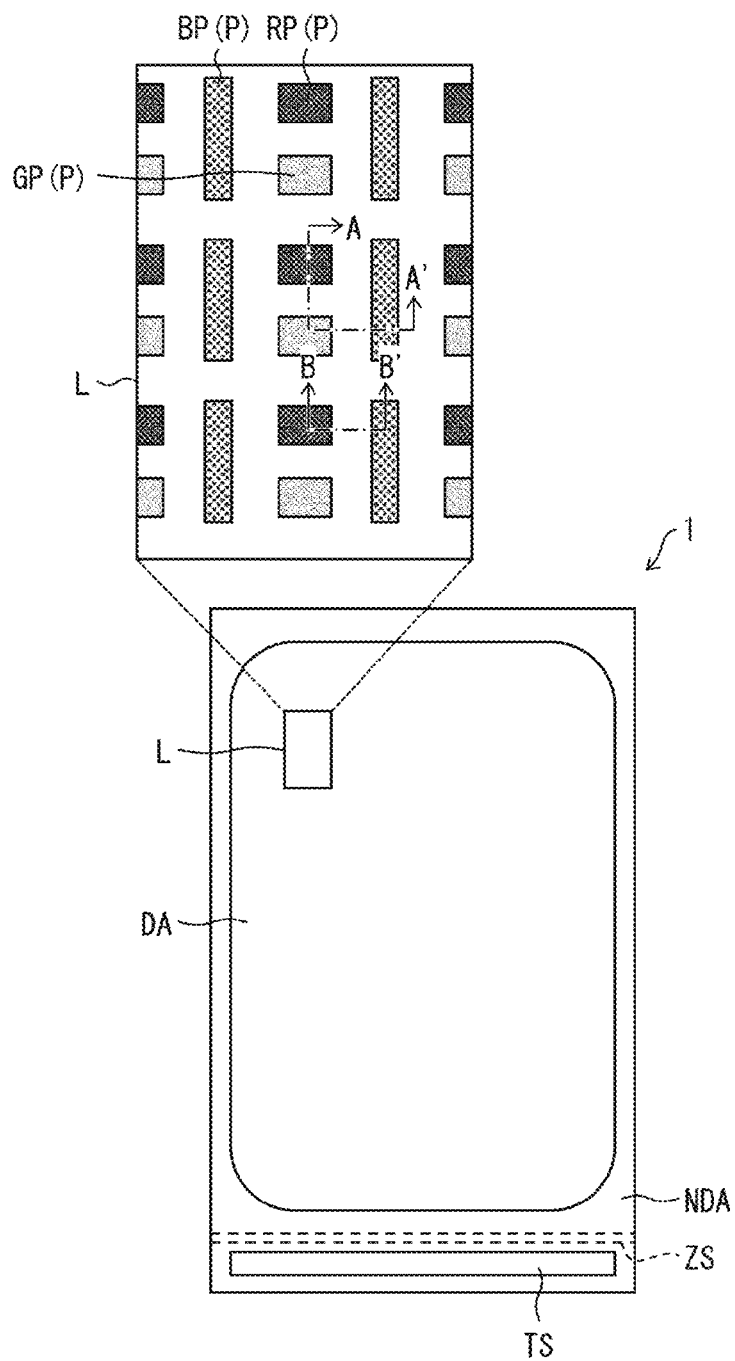
FIG. 2 is a partially enlarged plan view illustrating an example of a schematic configuration of the display device according to the first embodiment.

FIG. 2 is a partially enlarged plan view illustrating an example of a schematic configuration of a display device 1 according to the present embodiment.

As illustrated in FIG. 2, the display device 1 has a display region DA including a plurality of pixels P and a frame region NDA provided around the display region DA so as to surround the display region DA.

The frame region NDA is a non-display region and includes a terminal portion TS and a bending portion ZS provided between the terminal portion TS and the display region DA. The terminal portion TS is provided with an electronic circuit board (not illustrated) such as an integrated circuit (IC) chip and a flexible printed circuit board (FPC).

A plurality of wiring lines including a plurality of scanning signal lines and a plurality of data signal lines are provided in the display region DA. The scanning signal lines extend in a row direction. The data signal lines extend in a column direction. The display device 1 is a full-color active matrix display device, and has a plurality of pixels P corresponding to intersections of these scanning signal lines and data signal lines.

The display device 1, as illustrated in an enlarged region L, which is part of the display region DA, has, for example, red (R) pixels RP, green (G) pixels GP, and blue (B) pixels BP as the pixels P. Note that in the present embodiment, when there is no need to distinguish between these pixels RP, GP, and BP, the pixels RP, GP, and BP are collectively referred to simply as "pixel P".

Hereinafter, the display device 1 will be described as having these pixels RP, GP, and BP. However, the above example is just an example, and the display device 1 may have pixels P including other than RGB.

FIG. 2 illustrates, as an example, a case in which the pixels P are arranged in a so-called PenTile arrangement with the blue pixel BP as a base pixel. Thus, in the display device 1 illustrated in FIG. 2, although the pixels BP are aligned in a straight line in the column direction, the pixels RP and the pixels GP are arranged alternately in the column direction. However, the pixel arrangement in the display device 1 is not limited to the PenTile arrangement, and may be another arrangement, such as a stripe arrangement.

Figure 1:
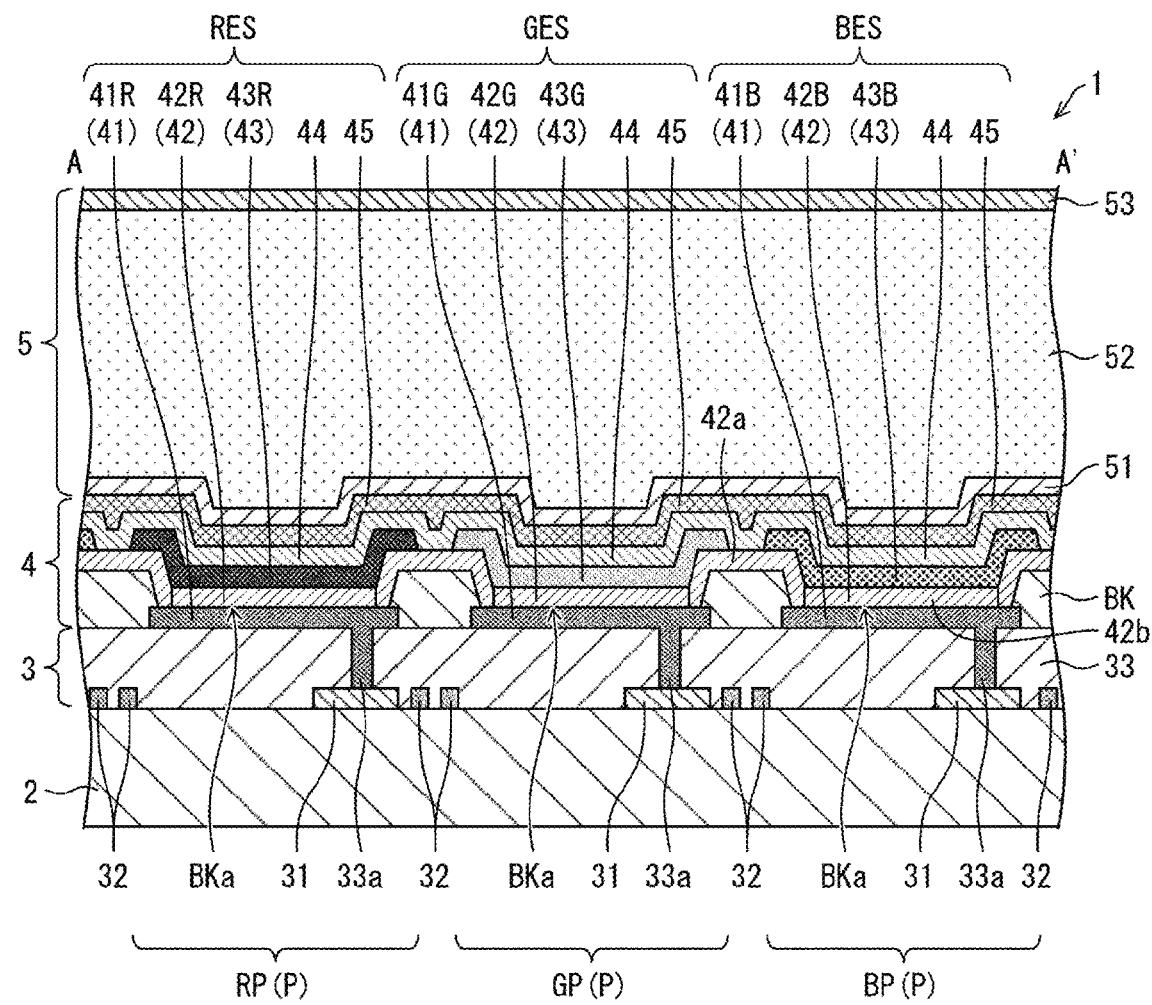
FIG. 1 is a cross-sectional view illustrating an example of a schematic configuration of a pixel in a display device according to a first embodiment.

FIG. 1 is a cross-sectional view illustrating an example of a schematic configuration of the pixel P in the display device 1 according to the present embodiment. Note that FIG. 1 is a cross-sectional view taken along a line A-A' illustrated in FIG. 2.

The display device 1 is a self-luminous display device called, for example, an organic electroluminescent (EL) display device. As illustrated in FIG. 1, each pixel P is formed with a self-luminous light-emitting element ES referred to as an organic light-emitting diode (OLED) or an organic EL element. Hereinafter, a case in which the display device 1 is an organic EL display device (OLED display) including an OLED as the light-emitting element ES will be described as an example. However, the present embodiment is not limited thereto, and the display device 1 may be a quantum dot light emitting diode (QLED) display including a QLED as the light-emitting element ES. Alternatively, the display device 1 may be an inorganic EL display device including an inorganic EL as the light-emitting element ES.

In the red pixel RP, a red light-emitting element (RES) that emits red light is provided as the light-emitting element ES. In the green pixel GP, a green light-emitting element (GES) that emits green light is provided as the light-emitting element ES. In the blue pixel BP, a blue light-emitting element (BES) that emits blue light is provided as the light-emitting element ES. Thus, the display region DA is provided with a plurality of light-emitting elements ES having different luminescent colors from each other. Note that in the present embodiment, when there is no need to distinguish between the light-emitting elements RES, GES, and BES, the light-emitting elements RES, GES, and BES are collectively referred to simply as "light-emitting element ES". The individual layers in the light-emitting elements ES are also collectively named in the same manner when there is no need to distinguish between the light-emitting elements RES, GES, and BES.

As illustrated in FIG. 1, the display device 1 includes a substrate 2, a thin film transistor layer 3, a light-emitting element layer 4, and a sealing layer 5 in this order.

The substrate 2 is a support body that supports individual layers from the thin film transistor layer 3 to the sealing layer 5. The substrate 2 may be, for example, an inorganic substrate made of an inorganic material such as glass, quartz, or ceramics, or a flexible substrate made primarily of resin such as polyethylene terephthalate, polycarbazole, or polyimide. For example, the substrate 2 can also be made of two layers of polyimide films and an inorganic film sandwiched therebetween. Alternatively, the substrate 2 may be a metal substrate made of metal such as aluminum or iron coated with an insulating film such as silicon oxide (SiOx), silicon nitride (SiNx), or an organic insulating material. Alternatively, the substrate 2 may be a metal substrate containing Al or the like, the surface of which is insulated by a method such as anodization.

When the display device 1 is a top-emission display device that emits light from above the light-emitting element ES (i.e., from the opposite side to the substrate 2 side of the light-emitting element ES), the substrate 2 used is not limited to a specific substrate. However, when the display device 1 is a bottom-emission display device that emits light from below the light-emitting element ES (i.e., from the back face side of the substrate 2), the substrate 2 is a transparent substrate that is transparent or semi-transparent.

A pixel circuit that controls each light-emitting element ES in the light-emitting element layer 4 and wiring lines 32 connected to the pixel circuit are formed in the thin film transistor layer 3. The wiring lines 32 include the plurality of scanning signal lines and the plurality of data signal lines described above. The pixel circuit is provided for each pixel P corresponding to each pixel P in the display region DA.

The pixel circuit controls current to the light-emitting element ES according to a gray-scale voltage. The configuration of the pixel circuit is not limited to a specific configuration as long as the light-emitting element ES in each pixel P can be driven individually. A plurality of thin film transistors 31 including a thin film transistor connected to a lower electrode of the light-emitting element ES in each pixel P are provided in each pixel circuit. Note that a configuration of a thin film transistor has been well known. Thus, illustrations and descriptions of individual layers in the thin film transistor 31 are omitted.

The plurality of thin film transistors 31 and the plurality of wiring lines 32 are covered with a flattening film 33. The thin film transistor layer 3 includes the plurality of thin film transistors 31 and the plurality of wiring lines 32, and the flattening film 33 that covers the plurality of thin film transistors 31 and the plurality of wiring lines 32.

In the flattening film 33, a contact hole 33a for electrically connecting the lower electrode in the light-emitting element ES to the thin film transistor 31 is provided. Thus, the thin film transistor 31 is electrically connected to the light-emitting element ES via the contact hole 33a. The flattening film 33 can be made of a coatable photosensitive organic material such as a polyimide resin or an acrylic resin, for example.

The light-emitting, element layer 4 includes the plurality of light-emitting elements ES (specifically, light-emitting elements RES, GES, and BES) described above. The light-emitting element ES is formed for each pixel P in correspondence with each pixel P as described above.

The light-emitting element ES is a self-luminous element. The light-emitting element ES according to the present embodiment includes a cathode electrode 45 and a light-emitting layer (hereinafter, referred to as "EML") 43 provided between an anode electrode 41 and the cathode electrode 45. Between the anode electrode 41 and the EML 43, a hole transport layer (hereinafter referred to as "HTL") 42 is provided as a carrier transport layer. Between the cathode electrode 45 and the EML 43, an electron transport layer (hereinafter referred to as "ETL") 44 is provided as a carrier transport layer.

Note that hereinafter, the carrier transport layer provided between the lower electrode and the EML 43 is referred to as "first carrier transport layer", and the carrier transport layer provided between the upper electrode and the EML 43 is referred to as "second carrier transport layer". Thus, in the present embodiment, the HTL 42 is the first carrier transport layer and the ETL 44 is the second carrier transport layer.

Further, in the following, the layers between the anode electrode 41 and the cathode electrode 45 in the light-emitting element ES are collectively referred to as function layers. The light-emitting element ES illustrated in FIG. 1 includes the HTL 42, the EML 43, and the ETL 44 as the function layers.

In the light-emitting element ES illustrated in FIG. 1, the lower electrode is the anode electrode 41 and the upper electrode is the cathode electrode 45. The anode electrode 41, which is the lower electrode, is a pixel electrode (patterned anode) that is patterned in an island shape for each pixel P (in other words, for each light-emitting element ES) corresponding to each pixel P. On the other hand, the cathode electrode 45, which is the upper electrode, is a common electrode (common cathode electrode) provided in common to all the pixels P (in other words, common to all the light-emitting elements ES).

The anode electrode 41 is formed on the flattening film 33 and adjacent to the flattening film 33. An edge (pattern edge) of the anode electrode 41 is covered with a bank BK referred to as an edge cover.

The light-emitting element layer 4 has a configuration in which the anode electrode 41, the bank BK, the HTL 42, the EML 43, the ETL 44, and the cathode electrode 45 are layered in this order from the thin film transistor layer 3 side.

The bank BK is an insulating layer for preventing a short circuit between the anode electrode 41 and the cathode electrode 45. The bank BK also functions as an element separation film (also referred to as a pixel separation film) that separates the light-emitting element ES in each pixel P. Openings BKa are provided in the bank BK for the respective pixels P. The openings BKa in the bank BK are the light-emitting regions of the respective pixels P. The bank BK may be formed of a coatable photosensitive organic material, such as a polyimide resin and an acrylic resin, for example.

The anode electrode 41 is made of a conductive material and functions as a hole injection layer (HIL) that injects positive holes into the HTL 42. The cathode electrode 45 is made of a conductive material and functions as an electron injection layer (EIL) that injects electrons into the ETL 44.

Of the anode electrode 41 and the cathode electrode 45, at least the electrode on the light extraction surface side needs to have optical transparency. On the other hand, the electrode on the side opposite to the light extraction surface may have optical transparency or light reflectivity.

For example, when the display device 1 is a top-emission display device, the cathode electrode 45, which is the upper electrode, is formed of a light transmissive electrode made of an optical transparent material, and the anode electrode 41, which is the lower electrode, is formed of a light-reflective electrode made of a light-reflective material. On the other hand, when the display device 1 is a bottom-emission display device, the cathode electrode 45, which is the upper electrode, is formed of a light-reflective electrode made of a light-reflective material, and the anode electrode 41, which is the lower electrode, is formed of a light transmissive electrode made of an optical transparent material.

A transparent electrode or a semitransparent electrode is used for the light transmissive electrode. For example, indium tin oxide (ITO) or indium zinc oxide (IZO), is used for the transparent electrode. For example, a thin metal film having optical transparency such as a magnesium silver alloy, is used for the semitransparent electrode. For example, a metal such as silver (Ag) or aluminum (Al), or an alloy containing these metals is used for the light-reflective electrode. Note that the electrode having light reflectivity may be obtained by forming a layered body of a light-transmissive material and a light-reflective material.

The HTL 42 is a layer that transports positive holes from the anode electrode 41 to the EML 43. The ETL 44 is a layer that transports electrons from the cathode electrode 45 to the EML 43. The HTL 42 and the ETL 44 are common layers provided in common to all the pixels P (in other words, common to all the light-emitting elements ES).

However, of the HTL 42 and the ETL 44, the HTL 42 includes a hole transport section 42b as a carrier transport section and an adjacent pixel hole blocking section 42a as an adjacent pixel carrier blocking section.

The hole transport section 42b has hole transport properties. The hole transport section 42b is provided overlapping the EML 43 in each light-emitting element ES for each light-emitting element ES, and transports positive holes as carriers to the EML 43.

The adjacent pixel hole blocking section 42a is provided in a portion between the light-emitting elements ES in the adjacent pixels P, and blocks transportation of positive holes between the light-emitting elements ES in the adjacent pixels P. Note that a size of the adjacent pixel hole blocking section 42a is not limited as long as the adjacent pixel hole blocking section 42a is provided between the hole transport sections 42b in the adjacent pixels P to enable blocking of transportation of positive holes between the light-emitting elements ES in the adjacent pixels P.

The hole transport section 42b and the adjacent pixel hole blocking section 42a can be formed, for example, by transforming at least part of the common layer provided in common to all the pixels P by a chemical reaction. The hole transport section 42b and the adjacent pixel hole blocking section 42a formed in this manner are chemically bonded to each other and are formed integrally with each other in the same layer. Further, the hole transport section 42b and the adjacent pixel hole blocking section 42a have, suitably, substantially the same thickness by transforming at least part of the common layer provided in common to all the pixels P by a chemical reaction as described above.

The hole transport section 42b is made of a hole transport material. On the other hand, the adjacent pixel hole blocking section 42a is made of a hole blocking material that blocks transportation of positive holes. The hole blocking material may be an organic insulating material or an electron transport material.

The hole transport section 42b may be formed by forming a film of a hole transport material, or may be formed by converting (transforming) an organic insulating material or an electron transport material into a hole transport material by a chemical reaction. Thus, the hole transport section 42b may be formed by transforming a hole blocking material used for the adjacent pixel hole blocking section 42a by a chemical reaction.

The adjacent pixel hole blocking section 42a may be formed by forming a film of an organic insulating material or an electron transport material, or may be formed by converting (transforming) an organic insulating material or a hole transport material into an electron transport material by a chemical reaction.

However, the present embodiment is not limited to the above configuration. The hole transport section 42b and the adjacent pixel hole blocking section 42a may be patterned with separate materials.

When the hole transport section 42b and the adjacent pixel hole blocking section 42a are patterned with separate materials, the patterning can be performed by any of the following methods, for example.

For example, when the materials of the hole transport section 42b and the adjacent pixel hole blocking section 42a are powders (solids), examples of the patterning method include (1) a method of separate patterning with vapor deposition using a fine metal mask (FMM), (2) an ink-jet method, and (3) a method of transferring the above materials into pixels RP, GP, and BP using silicon rubbers having patterns corresponding to the pixels RP, GP, and BP.

When the materials of the hole transport section 42b and the adjacent pixel hole blocking section 42a are liquids, examples of the patterning method include the method (2) described above, the method (3) described above, and (4) a method performing photolithography after applying the above materials onto the entire surface of the substrate, and (5) a method of laser processing after applying the above materials onto the entire surface of the substrate.

In a case in which the hole transport section 42b and the adjacent pixel hole blocking section 42a are patterned separately, when at least one of the hole transport section 42b and the adjacent pixel hole blocking section 42a is subjected to conversion (transformation) of the material, the conversion (transformation) of the material may be performed after patterning the section to be subjected to the conversion (transformation) of the material, or may be performed after patterning both the hole transport section 42b and the adjacent pixel hole blocking section 42a. When the film formation and patterning are performed separately, the conversion (transformation) of the above material may be performed after patterning, or may be performed after film formation and before patterning.

When forming the hole transport section 42b and the adjacent pixel hole blocking section 42a by transforming at least part of the common layer by a chemical reaction as described above, the hole transport section 42b and the adjacent pixel hole blocking section 42a are chemically bonded to each other by covalent bonds.

On the other hand, when the hole transport section 42b and the adjacent pixel hole blocking section 42a are patterned with separate materials, the hole transport section 42b and the adjacent pixel hole blocking section 42a are chemically bonded to each other by, for example, intermolecular forces (van der Waals forces) or hydrogen bonds between chemical substances of the materials to form a single integrated layer. Also in this case, the adjacent pixel hole blocking section 42a formed integrally with the hole transport sections 42b is provided between the adjacent hole transport sections 42b in the same layer.

As the hole transport material, at least one hole transport material is selected from the group consisting of inorganic hole transport materials including graphene oxide, copper thiocyanate (CuSCN), and tungsten oxide ($WO_{3-x}$), and organic hole transport materials including 2,6-Bis(9H-carbazol-9-yl)pyridine, 4,4'-Bis(3-ethyl-N-carbazolyl)-1,1'-biphenyl, 4-(Dibenzylamino)benzaldehyde-N,N'-diphenylhydrazone, 9,9'-[2,2'-Dimethyl(1,1'-biphenyl)-4,4'-diyl]bis-9H-carbazole, 2,2'-Dimethyl-N,N'-di(1-naphthyl-N,N'-diphenyl)-1,1'-biphenyl-4,4'-diamine, 9,9'-Dimethyl-N,N'-di(1-naphthyl)-N,N'-diphenyl-9H-fluorene-2,7-diamine, N,N'-Di(2-naphthyl-N,N'-diphenyl)-1,1'-biphenyl-4,4'-diamine, N,N'-Diphenyl-N,N'-bis[4-(phenyl-m-tolylamino)phenyl]biphenyl-4,4'-diamine, N,N'-Diphenyl-N,N'-di-p-tolylbenzene-1,4-diamine, N,N'-Di(1-naphthyl)-N,N'-diphenyl-1,1'-biphenyl-4,4'-diamine, N4,N4'-Bis{4-[bis(3-methylphenyl)amino]phenyl}-N4,N4'-diphenyl-(1,1'-biphenyl)-4,4'-diamine ("DNTPD"), 3-(4,6-Diphenyl-1,3,5-triazin-2-yl)-9-phenyl-9H-carbazole ("DPTPCz"), 9-(2-Ethylhexyl)-N,N,N,N-tetrakis(4-methoxyphenyl)-9H-carbazole-2,7-diamine ("EH44"), Indium(III) phthalocyanine chloride, Poly[N,N'-bis(4-butylphenyl)-N,N'-bis(phenyl)-benzidine]("Poly-TPD"), 2,8-Bis(diphenylphosphine oxide)dibenzofuran ("PPF"), 4,4',4'',4'''-Silanetetrayltetrakis(N,N-bis(4-methoxyphenyl))aniline ("Si—OMeTPA"), Spiro[9H-fluorene-9,9'-(9H)xanthine]-2,7-diamine, Spiro[9H-fluorene-9,9'-(9H)xanthine]-2,2',7,7'-tetramine, 2,4,6-Tris[3-(carbazole-9-yl)phenyl]triazine ("TCPZ"), N,N,N',N'-Tetrakis(4-methoxyphenyl)benzidine, N,N,N',N'-Tetrakis(3-methylphenyl)-3,3'-dimethylbenzidine, N,N,N',N'-Tetrakis(2-naphthyl)benzidine, Tetra-N-phenylbenzidine, N,N,N',N'-Tetraphenylnaphthalene-2,6-diamine, Poly[(9,9-dioctylfluorenyl-2,7-diyl)-co-{4,4'-[N-(4-sec-butylphenyl)diphenylamine]}] ("TFB"), Titanyl phthalocyanine, 1,3,5-Tris[(3-methylphenyl)phenylamino]benzene, 4,4',4''-Tris[2-naphthyl(phenyl)amino]triphenylamine, Vanadyl phthalocyanine, 4,4'-Cyclohexylidenebis[N,N-bis(4-methylphenyl)benzenamine], Dipyrazino[2,3-f:2',3'-h]quinoxaline-2,3,6,7,10,11-hexacarbonitrile, Tin (IV)2,3-naphthalocyanine dichloride, N2,N2,N2',N2',N7,N7,N7',N7'-Octakis(4-methoxyphenyl)-9,9'-spirobi[9H-fluorene]-2,2',7,7'-tetramine ("Spiro-MeOTAD"), Titanyl phthalocyanine, 1,3,5-Tris(2-(9-ethylcarbazyl-3)ethylene)benzene, Tris(4-carbazoyl-9-ylphenyl)amine, Tris[4-(diethylamino)phenyl]amine, 1,3,5-Tris(diphenylamino)benzene, 4,4',4''-Tris[phenyl(m-tolyl)amino]triphenylamine, 4,4'-Bis(N-carbazolyl)-1,1'-biphenyl, 1,3-Bis(N-carbazolyl)benzene, 1,4-Bis(N-carbazolyl)benzene, N,N'-Bis(3-methylphenyl)-N,N'-diphenylbenzidine, Poly(N-ethyl-2-vinylcarbazole), Poly[bis(4-phenyl)(2,4,6-trimethylphenyl)amine], Poly(9-vinylcarbazole), Poly(1-vinylnaphthalene), Poly(2-vinylnaphthalene), Poly(copper phthalocyanine), and Copper(II) phthalocyanine. Note that when the hole transport material is an inorganic hole transport material, the inorganic hole transport material may be nanoparticles.

A known photosensitive resin that can be patterned can be used as the organic insulating material. As the organic insulating material, for example, at least one resin is selected from the group consisting of polyimide (PI), polyetherimide (PEI), polyacrylonitrile (PAN), polyetheretherketone (PEEK), polyvinyl alcohol (PVA), polyisoprene, novolac resin, and polyacrylamide.

As the electron transport material, at least one electron transport material is selected from the group consisting of inorganic electron transport materials including graphene, tin(IV) oxide, and zinc oxide, and organic electron transport materials including Tris(2,4,6-trimethyl-3-(pyridin-3-yl)phenyl)borane ("3TPYMB"), 4,6-Bis(3,5-di(pyridin-3-yl)phenyl)-2-methylpyrimidine ("B3PYMPM"), 1,3-Bis(3,5-dipyrid-3-ylphenyl)benzene ("B3PyPB"), 2,7-Bis(2,2'-bipyridin-5-yl)triphenylene ("BPy-TP2"), Lithium 8-quinolinolate, Poly[(9,9-bis(3'-((N,N-dimethyl)-N-ethylammonium)-propyl)-2,7-fluorene)-alt-2,7-(9,9-dioetylfluorene)]dibromide ("PFN-Br"), Poly[(9,9-bis(3'-(N,N-dimethylamino)propyl)-2,7-fluorene)-alt-2,7-(9,9-dioctylfluorene)] ("PFN-DOF"), (1,3,5-Triazine-2,4,6-triyl)tris(benzene-3,1-diyl)tris(diphenylphosphine oxide) ("PO-T2T"), 2,5,8,11-Tetrakis(1,1-dimethylethyl)perylene ("TBPe"), 1,3,5-Tris(3-pyridyl-3-phenyl)benzene ("TmPyPB"), 1,3,5-Tris(1-phenyl-1H-benzimidazol-2-yl)benzene ("TPBi"), Diphenyl [4-(triphenylsilyl)phenyl]phosphine oxide ("TSPO1"), 3,5-Diphenyl-4-(1-naphthyl)-1H-1,2,4-triazole, Tris(8-hydroxyquinoline)aluminum, 2,9-Dimethyl-4,7-diphenyl-1,10-phenanthroline ("Bathocuproine"), 4,7-Diphenyl-1,10-phenanthroline ("Bathophenanthroline"), 2,5-Bis(1-naphthyl)-1,3,4-oxadiazole, Bis(8-hydroxy-2-methylquinoline)-(4-phenylphenoxy)aluminum, 3,5-Bis(4-tert-butylphenyl)-4-phenyl-4H-1,2,4-triazole, 2-(4-Biphenylyl)-5-phenyl-1,3,4-oxadiazole, 3-(Biphenyl-4-yl)-5-(4-tert-butylphenyl)-4-phenyl-4H-1,2,4-triazole, and 2-(4-tert-butylphenyl)-5-(4-biphenylyl)-1,3,4-oxadiazole.

Note that when the electron transport material is an inorganic electron transport material, the inorganic electron transport material may be nanoparticles.

When the adjacent pixel hole blocking section 42a is made of an electron transport material, the electron transport material may be graphene derived from an organic insulating material (derived graphene). For example, organic insulating materials such as PI, PEI, and PAN have sufficient heat resistance and contain carbon so that the organic insulating materials are converted into graphene by exposure to laser light, for example. Note that when PAN is used as the organic insulating material, the PAN is converted into graphene by gradually heating.

The laser source is not limited as long as the laser source has a laser excitation wavelength matching an absorption wavelength of the organic insulating material (resin) forming the organic insulating film.

Examples of the laser source include a $CO_2$ laser, a solid state laser, a gas-phase laser, an infrared laser, an ultraviolet laser, and a visible laser. Note that these laser sources can be used in combination. The laser sources can be used at various wavelengths. The laser sources can be operated in various power ranges. The laser sources have various pulse widths (pulse time widths).

When the organic insulating film is, for example, PI, PEI, or PAN, a $CO_2$ laser is suitably used as the laser source. In this case, laser scribing for selectively irradiating individual pixels P with laser light can be incorporated into a $CO_2$ laser cutter system. The CO₂ laser cutter system can align a laser head to the pixel P, set laser intensity, set scan rate intensity, and the like.

As described above, the hole transport section 42b can be formed, for example, by transforming the hole blocking material by a chemical reaction. For example, when the hole blocking material is graphene, the graphene has electron transport properties, but is converted into graphene oxide having hole transport properties by an oxidation reaction.

Graphene has, for example, a structure represented in the following structural formula (1). Graphene oxide has, for example, a structure represented in the following structural formula (2).

[Chem. 1]

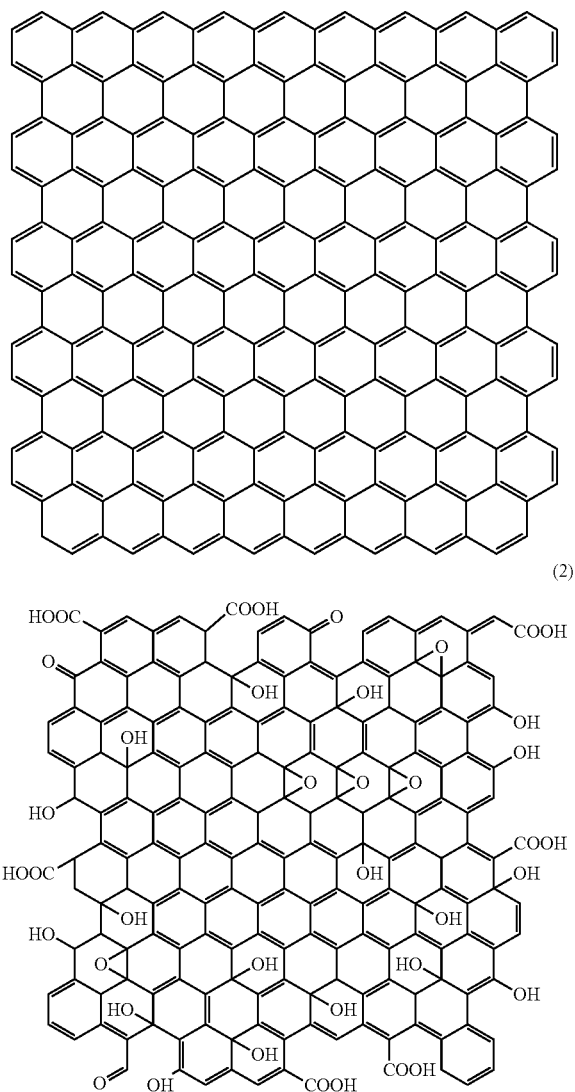

Note that as described above, the graphene film changed (in other words, converted) from an organic insulating film such as PI by laser irradiation has a structure in which single graphene flakes are randomly overlapped and portions at which the single graphene flakes are in contact with each other are chemically bonded to connect the single graphene flakes to each other.

The graphene oxide film obtained by oxidizing the graphene film has a structure in which single graphene oxide flakes are randomly overlapped and portions at which the single graphene oxide flakes are in contact with each other are chemically bonded to connect the single graphene oxide flakes to each other.

Examples of methods of oxidizing graphene to obtain graphene oxide include, for example, the Staudenmaier method, the Brodie method, the Hofmann method, the Hummers method, and the Tour method. Among these methods, the Tour method is considered to be suitable for production in comprehensive consideration of reaction time, simplicity, toxicity, and the like.

Graphene is transformed into graphene oxide by exposure to a solution of, for example, potassium permanganate ($KMnO_4$) dissolved in sulfuric acid ($H_2SO_4$).

Graphene is also transformed into graphene oxide by doping with oxygen by $UV/O_3$ treatment using ozone ($O_3$) induced by ultraviolet (UV) light (see, for example, NPL 1).

Thus, for example, by converting part of the common layer made of the organic insulating material or the electron transport material into a hole transport material, the hole transport section 42b made of the hole transport material and the adjacent pixel hole blocking section 42a made of the organic insulating material or the electron transport material that is not converted into the hole transport material can be integrally formed in the same layer.

As described above, when the adjacent pixel hole blocking section 42a is, for example, graphene derived from an organic insulating material, by converting the organic insulating material into a hole transport material and an electron transport material, the hole transport section 42b made of the hole transport material and the adjacent pixel hole blocking section 42a made of the electron transport material can be integrally formed in the same layer. Thus, a hole blocking material for forming the adjacent pixel hole blocking section 42a may be the same as or different from a hole blocking material prior to conversion (transformation) into a hole transport material.

As described above, the adjacent pixel hole blocking section 42a may be formed by, for example, transforming a hole transport material by a chemical reaction. For example, graphene oxide has hole transport properties as described above, but is converted into graphene by reducing (reduced graphene oxide). Graphene reduced from graphene oxide (reduced graphene oxide) has defects but has electron transport properties (e.g., approximately $2\times10^2$ S/m) (see, for example, NPL 2).

Examples of known methods of reducing graphene oxide include, for example, a thermal reduction method in which graphene oxide is heated to a high temperature to separate oxygen-containing groups, and a chemical reduction method using a reducing agent.

Examples of the chemical reduction method include, for example, a reduction method using hydrazine ($N_2H_4$) as a reducing agent as shown in the following formula (3) (see, for example, NPL 2). Note that the following formula shows a reaction scheme of graphene oxide and hydrazine as an example of the chemical reduction method. Note that, for convenience of illustration, only part of graphene oxide involved in the reaction with hydrazine is shown in the following formula.

[Chem. 2]

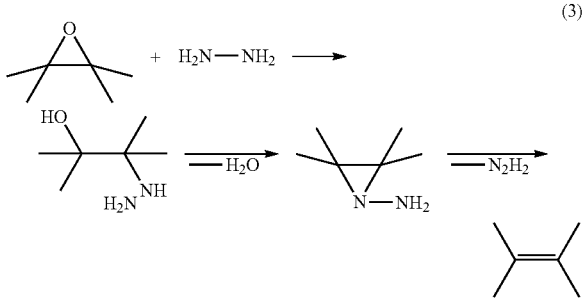

(3)

It is also known that in the reduction of graphene oxide, sodium borohydride ($NaBH_4$), ascorbic acid, hydrogen iodide (HI), or the like can be used as a reducing agent instead of hydrazine. Graphene oxide can be reduced in an aqueous solution or in a thin film state.

It is also known that graphene oxide is reduced to graphene by irradiation with a femtosecond laser (see, for example, NPL 3).

Thus, by converting part of the common layer made of a hole transport material such as graphene oxide into an electron transport material, the adjacent pixel hole blocking section 42a made of the electron transport material and the hole transport section 42b made of graphene oxide that is not converted into the electron transport material may be integrally formed in the same layer.

A thickness of the HTL 42 is more preferably 30 nm or more for adjusting an optical path length. Further, the thickness of the HTL 42 is more preferably 300 nm or less in order to reduce manufacturing costs.

Note that the hole transport section 42b and the adjacent pixel hole blocking section 42a preferably have substantially the same thickness as described above, but they may have different thicknesses from each other. In a case in which the hole transport section 42b is formed by transforming an organic insulating material by a chemical reaction, when a thickness of part of the organic insulating material that is not transformed is within a range of 0.5 nm to 3 nm, it is possible to transport positive holes to the EML 43 by a tunneling effect. Thus, when the thickness of the HTL 42 has a thickness of greater than 3 nm at which the tunneling effect is not expressed, and the thickness of the part of the organic insulating material that is not transformed is within a range of 0.5 nm to 3 nm at which the tunneling effect is expressed, the hole transport section 42b may be provided only on the surface of the HTL 42.

On the other hand, in the light-emitting elements ES illustrated in FIG. 1, the ETL 44 is made of an electron transport material common to all the pixels P (in other words, common to all the light-emitting elements ES). In this case, a known electron transport material can be used for the ETL 44. The electron transport material is not limited to any specific material, and for example, at least one electron transport material selected from the group consisting of the electron transport materials exemplified above can be used.

In this case, a thickness of the ETL 44 can be set similarly to that of a known ETL. The thickness of the ETL 44 is set within a range of 30 nm or less, for example. When the thickness of the ETL 44 exceeds 30 nm, the mobility slows down, so the drive voltage of the display device 1 tends to increase.

The EML 43 is a layer that functions to emit light by recombining positive holes ($h^+$) injected from the anode electrode 41 and electrons ($e^-$) injected from the cathode electrode 45.

When the light-emitting element ES is an OLED, in the light-emitting element ES, light is emitted in the process in which excitons generated by recombination of positive holes and electrons in the EML 43 by a drive current between the anode electrode 41 and the cathode electrode 45 transit to a ground state. Note that when the light-emitting element ES is a QLED, light (fluorescence or phosphorescence) is emitted in the process in which excitons generated by recombination of positive holes and electrons in the EML 43 by a drive current between the anode electrode 41 and the cathode electrode 45 transit from a conduction band level to a valence band level of the quantum dot. However, the light-emitting element ES may be a light-emitting element other than the OLED or the QLED (e.g., an inorganic light-emitting diode, etc.).

The EML 43 is patterned on the HTL 42 in an island shape for each pixel P (in other words, for each light-emitting element ES) corresponding to each pixel P and covering at least the opening BKa in the bank BK.

When the light-emitting element ES is an OLED, the EML 43 is made of an organic luminescent material such as a low molecular weight fluorescent dye or a metal complex. Note that the organic luminescent material may be a phosphorescent material or a fluorescent material. The EML 43 may be formed of a two-component system of a host material that transports positive holes and electrons and a luminescent dopant material that emits light as a luminescent material. Alternatively, the EML 43 may be made of a luminescent material alone.

Note that when the light-emitting element ES is a QLED, the EML 43 includes, for example, nano-sized quantum dots (semiconductor nanoparticles) as a luminescent material. A known quantum dot can be employed for this quantum dot. This quantum dot may contain, for example, at least one semiconductor material made of at least one element selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg). The quantum dots may be of a two-component core type, a three-component core type, a four-component core type, a core-shell type, or a core multi-shell type. Further, the quantum dots may contain nanoparticles doped with at least one of the elements described above or may have a compositionally graded structure.

As illustrated in FIG. 1, the light-emitting element RES includes an anode electrode 41R, an HTL 42R, an EML 43R, the ETL 44, and the cathode electrode 45. The light-emitting element GES includes an anode electrode 41G, an HTL 42G, an EML 43G, the ETL 44, and the cathode electrode 45. The light-emitting element BES includes an anode electrode 41B, an HTL 42B, an EML 43B, the ETL 44, and the cathode electrode 45. The HTL 42R is the hole transport section 42b of the HTL 42 in the pixel RP. The HTL 42G is the hole transport section 42b of the HTL 42 in the pixel GP. The HTL 42B is the hole transport section 42b of the HTL 42 in the pixel BP.

The sealing layer 5 is a layer that prevents penetration of foreign matters such as water or oxygen into the light-emitting element layer 4. The sealing layer 5 includes, for example, an inorganic sealing film 51 that covers the upper electrode (cathode electrode 45 in the present embodiment), an organic buffer film 52 on the inorganic sealing film 51, and an inorganic sealing film 53 on the organic buffer film 52.

The inorganic sealing film 51 and the inorganic sealing film 53 are transparent inorganic insulating films and can be formed of inorganic insulating films such as silicon oxide films or silicon nitride films formed by chemical vapor deposition (CVD). The organic buffer film 52 is a transparent organic insulating film having a flattening effect and can be made of a coatable organic material such as acrylic. The organic buffer film 52 can be formed by, for example, ink-jet coating, and a bank (not illustrated) for stopping droplets may be provided in the frame region NDA.

A function film (not illustrated) is provided on the sealing layer 5. The function film has, for example, at least one of an optical compensation function, a touch sensor function, and a protection function.

Method for Manufacturing Display Device 1

Next, a method for manufacturing the display device 1 will be described.

Figure 3:
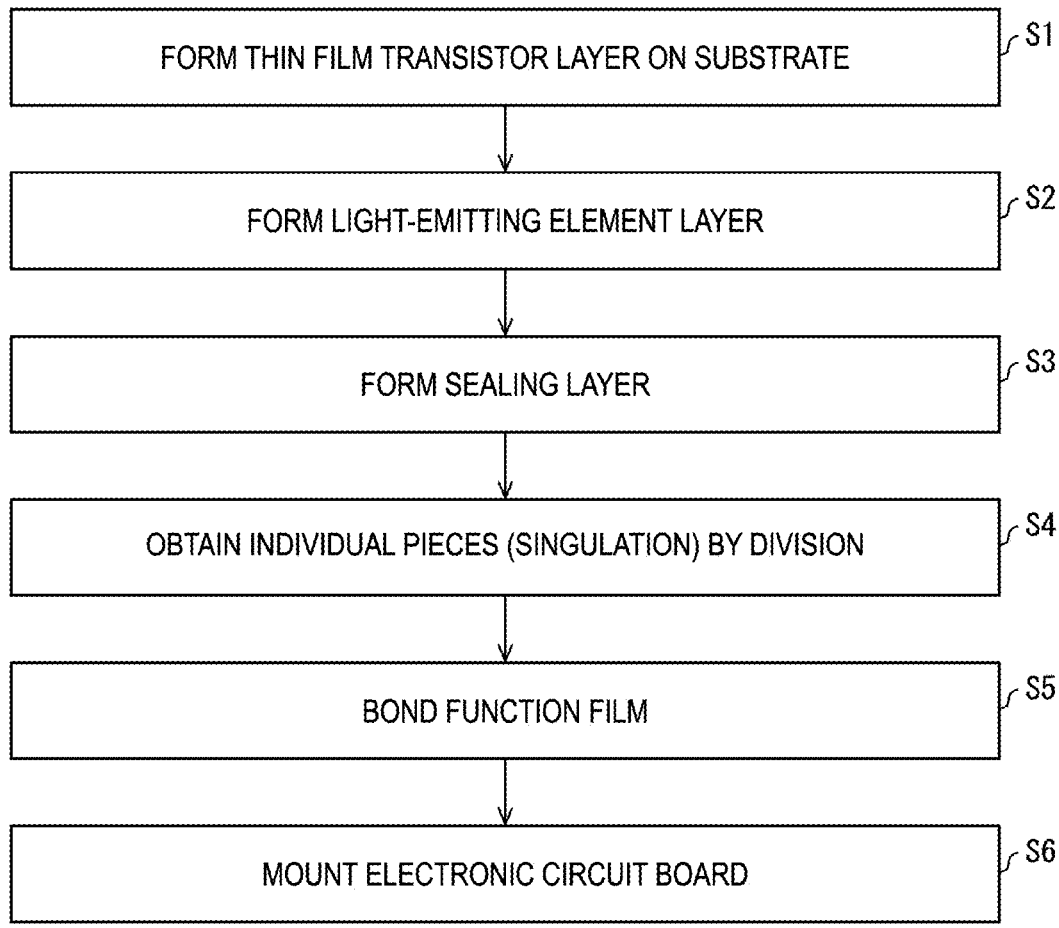
FIG. 3 is a flowchart showing manufacturing steps of the display device according to the first embodiment in order of steps.

FIG. 3 is a flowchart showing manufacturing steps of the display device 1 in order of steps.

As shown in FIG. 3, in the manufacturing steps of the display device 1 according to the present embodiment, first, the thin film transistor layer 3 including the plurality of thin film transistors 31 and the wiring lines 32, and the flattening film 33 covering the thin film transistors 31 and the wiring lines 32, is formed on the substrate 2 (step S1). Subsequently, the light-emitting element layer 4 is formed on the thin film transistor layer 3 (step S2). Subsequently, the sealing layer 5 is formed on the light-emitting element layer 4 so as to cover the light-emitting element layer 4 (step S3). As described above, the inorganic sealing film 51 and the inorganic sealing film 53 can be formed by, for example, CVD. The organic buffer film 52 can be formed using a coating method, such as an ink-jet method. Subsequently, a layered body including the substrate 2, the thin film transistor layer 3, the light-emitting element layer 4, and the sealing layer 5 is divided to obtain a plurality of individual pieces (step S4). Subsequently, the function film (not illustrated) is bonded to the obtained individual piece (step S5). Subsequently, an electronic circuit board (e.g., an IC chip and an FPC) (not illustrated) is mounted on part of the frame region NDA (terminal portion TS) outside the display region DA in which the plurality of pixels P are formed (step S6). In this manner, the display device 1 according to the present embodiment is manufactured. Note that steps S1 to S6 are performed by a display device manufacturing apparatus (including film formation apparatuses that perform the respective steps S1 to S3).

When manufacturing a flexible display device as the display device 1, a step of forming a resin layer on a transparent support substrate (e.g., mother glass) and a step of forming a barrier layer on the resin layer may be further provided before step S1. In this case, in step 1, the thin film transistor layer 3 is formed on the barrier layer. After forming the sealing layer 5 in step S3, an upper face film is bonded on the sealing layer 5. Thereafter, the support substrate is peeled off from the resin layer by irradiation with laser light or the like, and a lower face film is bonded to a lower face of the resin layer. Thereafter, in step S4, a layered body including the lower face film, the resin layer, the barrier layer, the thin film transistor layer 3, the light-emitting element layer 4, the sealing layer 5, and the upper face film is divided to obtain a plurality of individual pieces.

Figure 4:
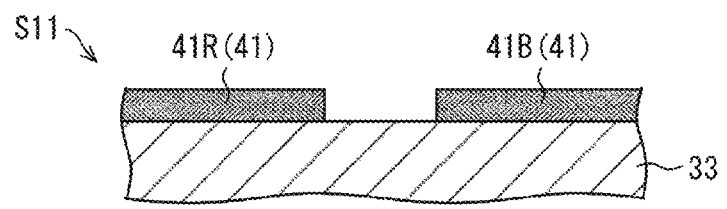
FIG. 4 illustrates cross-sectional views of several steps of forming a light-emitting element layer in the display device according to the first embodiment in order of steps.
Figure 4:
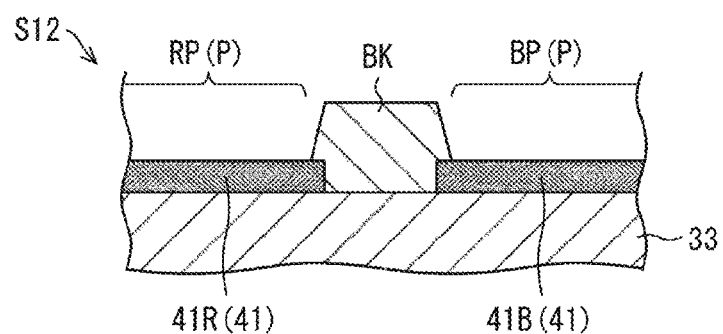
Figure 4:
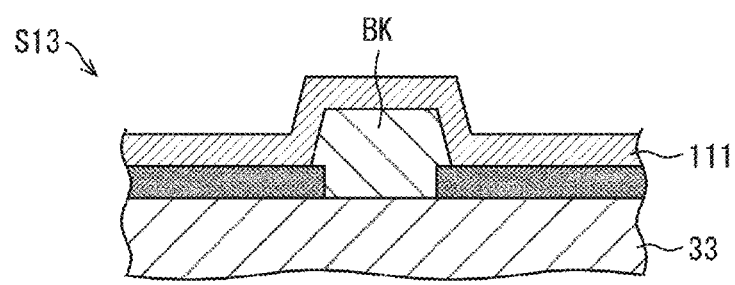
Figure 4:
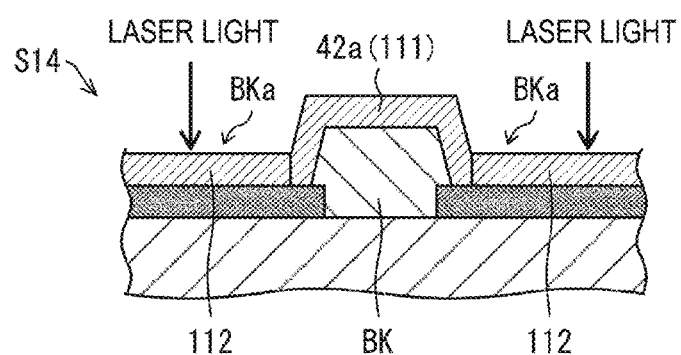
Figure 5:
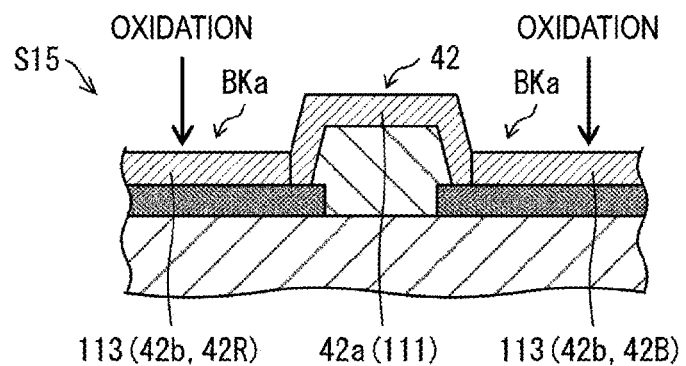
FIG. 5 illustrates other cross-sectional views of several steps of forming the light-emitting element layer in the display device according to the first embodiment in order of steps.
Figure 5:
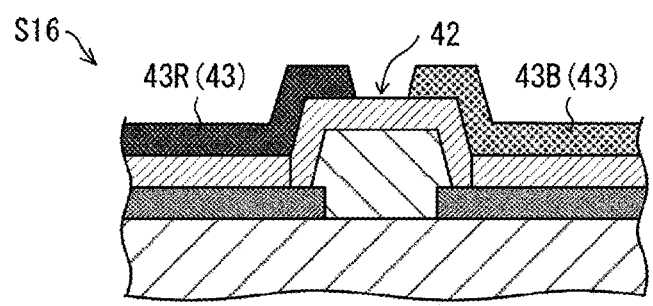
Figure 5:
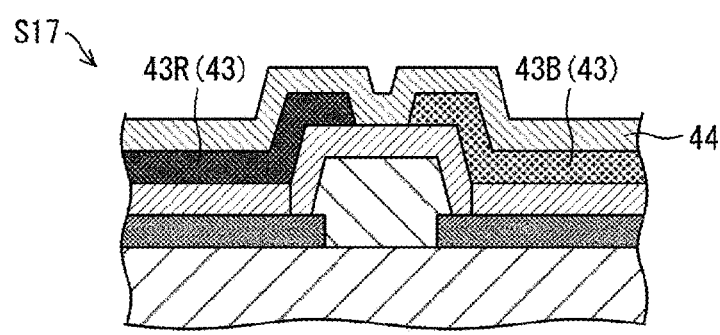
Figure 5:
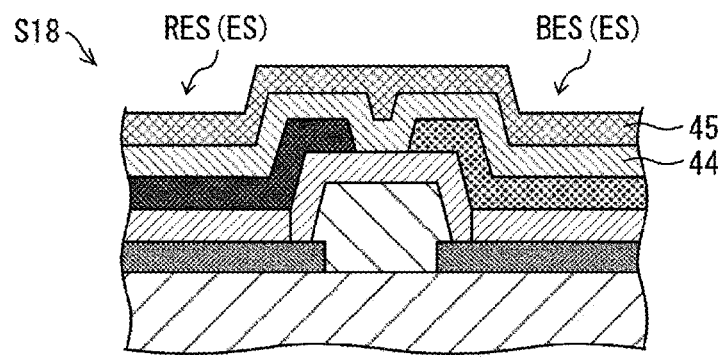

FIGS. 4 and 5 each illustrate cross-sectional views of several steps of forming the light-emitting element layer 4 in step S2 in order of steps. FIG. 5 illustrates a manufacturing step after the manufacturing step illustrated in FIG. 4. Note that FIGS. 4 and 5 illustrate cross sections corresponding to part of a cross section taken along a line B-B' illustrated in FIG. 2. Step S2 includes steps S11 to S14 illustrated in FIG. 4 and steps S15 to S18 illustrated in FIG. 5.

In the following, a case of forming the hole transport section 42b and the adjacent pixel hole blocking section 42a by transforming at least part of an organic insulating film provided in common to all the pixels P as the common layer by a chemical reaction will be described as an example.

In step S2, first, as illustrated in S11 in FIG. 4, the anode electrode 41 is patterned as the lower electrode on the flattening film 33 in the thin film transistor layer 3 in an island shape for each pixel P (step S11, step of forming a lower electrode). Any of various known methods for forming an anode electrode, such as sputtering, a vacuum vapor deposition technique, CVD, plasma CVD, and a printing method, can be used to form the anode electrode 41.

Subsequently, as illustrated in S12 in FIG. 4, the bank BK that serves as the pixel separation film is formed on the flattening film 33 so as to cover the pattern edges of the anode electrodes 41 in the respective pixels P (step S12). The bank BK can be formed by applying an organic material such as polyimide or acrylic on the flattening film 33 so as to cover the anode electrodes 41 and then patterning the applied organic material by photolithography.

Subsequently, as illustrated in S13 in FIG. 4, on the anode electrodes 41 and the bank BK, an organic insulating film 111 is formed by applying an organic insulating material that is finally converted into a material having hole transport properties by a chemical reaction in solid-like over all the pixels P (step S13, first film forming step).

Examples of the organic insulating film 111 include resin films made of organic insulating materials such as PI, PEI, and PAN, as described above. As previously mentioned, these organic insulating materials have sufficient heat resistance and contain carbon so that these organic insulating materials are converted into graphene by exposure to laser light. Graphene has electron transport properties, but is converted into graphene oxide having hole transport properties by an oxidation reaction.

In the following, a case in which a resin that serves as a graphene precursor material that is converted into graphene by exposure to laser light as described above is used for the organic insulating film 111 will be described as an example.

The organic insulating film 111 can be formed by applying a resin precursor such as a PI precursor, a PEI precursor, or a PAN precursor using a known thin film forming technique such as spin coating, and curing the applied resin precursor with heat or light (e.g., ultraviolet light).

Subsequently, as illustrated in S14 in FIG. 4, only the individual pixels P (specifically, the openings BKa in the bank BK) are selectively irradiated with laser light.

In the present embodiment, as an example, PI is used for the organic insulating film 111 and a laser system using a $CO_2$ laser as the laser source is used. Also, as an example, the pulse time width is approximately 14 µs, the laser excitation wavelength is 10.6 µm, the beam size width is approximately 120 µm, the laser power is in a range of 2.4 W or more and 5.4 W or less, the scan rate is 3.5 inch/s$^{-1}$, and the number of pulses per inch is 1000 p.p.i.

Figure 6:
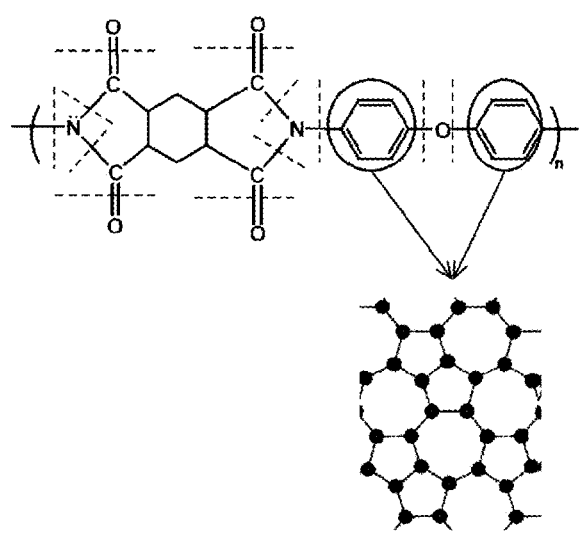
FIG. 6 is a diagram illustrating a thermal reaction of polyimide by laser irradiation.

FIG. 6 is a diagram illustrating a thermal reaction of PI by laser irradiation. As illustrated in FIG. 6, the thermal reaction of PI by laser irradiation breaks heteroatom bonds (e.g., C=O bonds, C—N bonds) of PI and the remaining aromatic compounds recombine to form graphene.

According to the present embodiment, in this manner, by irradiating only each pixel P (specifically, the opening BKa in the bank BK) with laser light, the organic insulating film 111 in each pixel P is converted into graphene. Thus, a graphene film 112 is formed in each pixel P, and the adjacent pixel hole blocking section 42a made of the organic insulating film 111 is formed between the adjacent pixels P to block transportation of positive holes between the light-emitting elements ES in the pixels P (step S14, first transformation step, first carrier transport section transformation step).

Subsequently, as illustrated in S15 in FIG. 5, the graphene film 112 is oxidized to convert the graphene film 112 into a graphene oxide film 113 (step S15, first transformation step, first carrier transport section transformation step). As previously mentioned, graphene oxide can be formed by oxidizing graphene.

As previously mentioned, graphene is transformed into graphene oxide by exposure to a solution of, for example, $KMnO_4$ dissolved in $H_2SO_4$.

For example, when the graphene formed on the substrate, obtained in step S14, is 10 g, the substrate is immersed in a mixture of 60 g of $KMnO_4$ in 1320 mL of a solution containing $H_2SO_4$ and phosphoric acid ($H_3PO_4$) at a ratio of 9:1, and rotated for 12 hours. After the surface of the substrate returns to room temperature, the substrate is immersed in 30% hydrogen peroxide water at 0° C., and after approximately five minutes, the substrate is washed with water, 30% hydrochloric acid, and ethanol. Finally, the substrate is dried in a vacuum chamber for 8 to 12 hours. Thus, the graphene film 112 formed on the substrate, obtained in step S14, can be converted into the graphene oxide film 113.

However, the above method is an example, and the present embodiment is not limited to the above method. For example, instead of immersing the substrate on which the graphene film 112 is formed, in the solution containing the oxidant, the graphene film 112 may be brought into contact with the oxidant by supplying a solution containing the oxidant to the substrate on which the graphene film 112 is formed.

Graphene oxide has hole transport properties. Thus, according to the present embodiment, the hole transport section 42b made of the graphene oxide film 113 can be formed in each pixel P through these steps.

Subsequently, as illustrated in S16 in FIG. 5, the EML 43 is formed, for each pixel P, on the HTL 42 provided with the adjacent pixel hole blocking section 42a and the hole transport section 42b (step S16, step of forming a light-emitting layer). At this time, the EML 43 is formed in an island shape for each pixel P (in other words, for each light-emitting element ES) so as to cover at least the opening BKa in the bank BK corresponding to each pixel P. A method of forming the EML 43 is not limited as long as a method is capable of forming a fine pattern required for the light-emitting element ES. Any of various known methods for forming an EML, such as vapor deposition and an ink-jet method, can be used to form the EML 43.

Subsequently, as illustrated in S17 in FIG. 5, the ETL 44 is formed on the EMLs 43 (step S17, step of forming a second carrier transport layer). Note that in the present embodiment, the ETL 44 is the common layer provided in common to all the pixels P as illustrated in FIG. 1, but the present embodiment is not limited thereto. Similar to the EML 43, the ETL 44 may be formed in an island shape for each pixel P (in other words, for each light-emitting element ES) so as to cover at least the opening BKa in the bank BK corresponding to each pixel P. Any of various known methods for forming an ETL, such as vapor deposition and an ink-jet method, can be used to form the ETL 44.

Subsequently, as illustrated in S18 in FIG. 5, the cathode electrode 45 is formed as the upper electrode on the ETL 44 (step S18, step of forming an upper electrode). Any of various known methods for forming a cathode electrode, such as sputtering, a vacuum vapor deposition technique, CVD, plasma CVD, and a printing method, can be used to form the cathode electrode 45.

Thus, the light-emitting element layer 4 including the plurality of light-emitting elements ES is formed on the flattening film 33.

Advantageous Effects

Next, effects of the display device 1 according to the present embodiment will be described below with reference to FIGS. 7 and 8.

Figure 7:
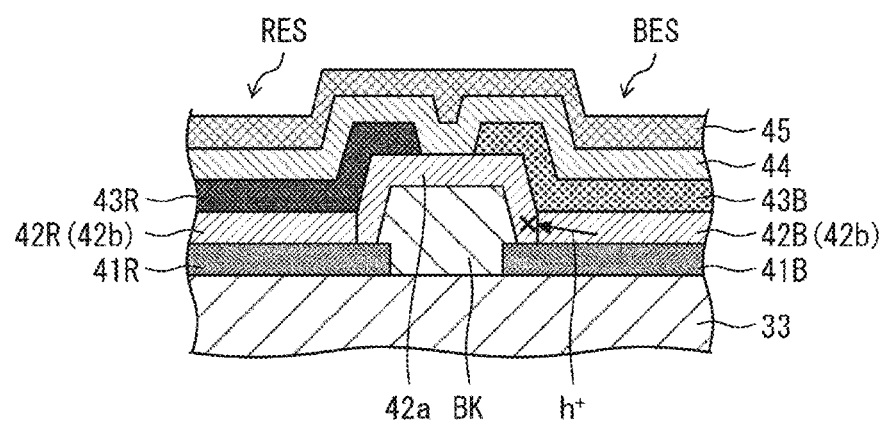
FIG. 7 is a cross-sectional view illustrating part of a cross section taken along a line B-B' illustrated in FIG. 2.
Figure 8:
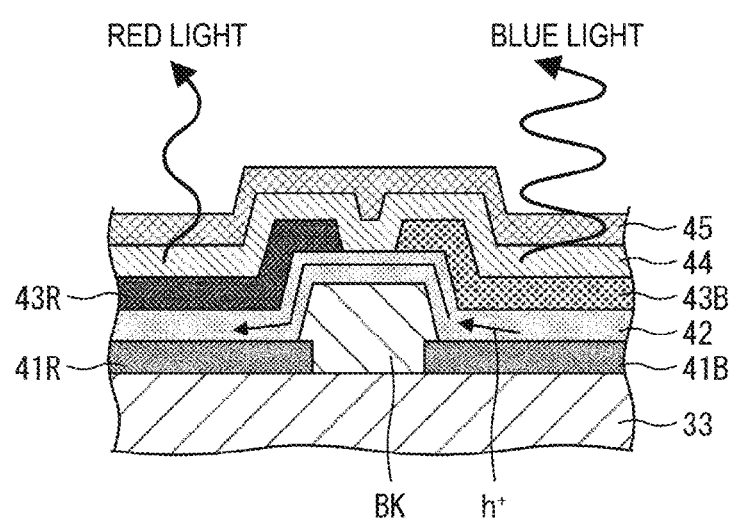
FIG. 8 is a cross-sectional view for explaining a problem in a known display device.

FIG. 7 is a cross-sectional view illustrating part of the cross section taken along a line B-B' illustrated in FIG. 2. FIG. 8 is a cross-sectional view for explaining a problem in a known display device. FIG. 8 illustrates a cross-section of the known display device that corresponds to the cross-section illustrated in FIG. 7. Note that in FIG. 8, constituent elements having the same functions as the constituent elements illustrated in FIG. 7 are designated by the same reference signs, and detailed descriptions thereof are omitted.

In the following, description will be made focusing on the HTL 42 as a known problem. As illustrated in FIG. 8, in a case in which the HTL 42 is provided in common to the plurality of light-emitting elements ES, for example, when the light-emitting element BES emits light, positive holes ($h^+$) are transported from the light-emitting element BES also to, for example, the light-emitting element RES adjacent to the light-emitting element BES via the HTL 42. As described above, of the cathode electrode 45 and the ETL 44, at least the cathode electrode 45 is the common layer provided in common to all the pixels P. Thus, when the light-emitting element BES emits light, electrons are transported also to, for example, the light-emitting element RES adjacent to the light-emitting element BES via at least the cathode electrode 45 of the cathode electrode 45 and the ETL 44. Thus, in the case in which the light-emitting element BES emits light as described above, when positive holes are transported to the light-emitting element RES of the adjacent pixel RP via the HTL 42, the positive holes and the electrons transported from the light-emitting element BES are recombined in the EML 43R of the light-emitting element RES, and the light-emitting element RES emits light weakly. Thus, in a case in which one light-emitting element ES emits light, when positive holes are transported to the EML 43 of the adjacent pixel P via the HTL 42, the light-emitting element ES of the adjacent pixel P emits light weakly. Note that as described above, FIG. 8 illustrates an example in which when the light-emitting element BES emits light, the light-emitting element RES of the pixel RP adjacent to the light-emitting element BES emits light weakly. However, at this time, the light-emitting element GES of the pixel GP adjacent to the light-emitting element BES also emits light weakly. Such a phenomenon is called optical crosstalk and causes deterioration of display quality.

On the other hand, as illustrated in FIG. 7, the display device 1 according to the present embodiment is provided with the adjacent pixel hole blocking section 42a between the light-emitting elements ES in the adjacent pixels P, which blocks transportation of positive holes between the light-emitting elements ES in the adjacent pixels P. Thus, as illustrated in FIG. 7, the transportation of positive holes to the light-emitting element ES in the adjacent pixel P is blocked. Thus, according to the present embodiment, it is possible to provide the display device 1 in which crosstalk does not occur.

In addition, according to the present embodiment, the hole transport section 42b and the adjacent pixel hole blocking section 42a are part of the HTL 42 that is the common layer. The HTL 42 and the display device 1 including the HTL 42 according to the present embodiment have a simpler processing process than a case in which the HTL 42 is formed in an island shape for each pixel P, thereby greatly reducing the manufacturing costs.

In particular, organic insulating materials used as graphene precursors are inexpensive compared to known hole transport materials, and the finally formed graphene oxides have high temperature stability and high chemical stability. Thus, according to the present embodiment, it is possible to provide the display device 1 that is more reliable than a display device formed using a known hole transport material. Further, graphene and graphene oxide have fast carrier transport properties. Thus, according to the present embodiment, the drive voltage and power consumption of the display device 1 can be reduced, and thus the display time and standby time of the display device 1 can be lengthened.

In addition, known organic materials used for the HTL may have poor adhesion to other materials. However, according to the present embodiment, as described above, the hole transport section 42b and the adjacent pixel hole blocking section 42a are part of the HTL 42, which is the common layer, are chemically bonded to each other, and are integrally formed with each other in the same layer. Thus, according to the present embodiment, the adhesion between the materials used in the hole transport section 42b and the adjacent pixel hole blocking section 42a is high, thereby preventing foreign matters such as water or oxygen from penetrating from the outside. Thus, according to the present embodiment, it is possible to provide the display device 1 with higher reliability.

First Modified Example

Figure 9:
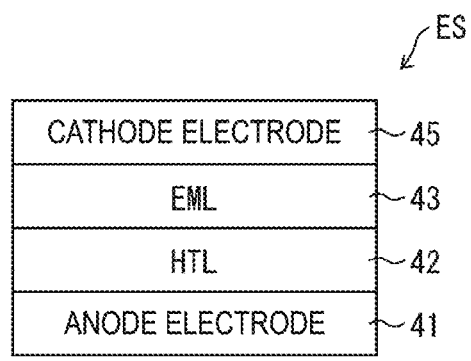
FIG. 9 is a diagram schematically illustrating another example of a layered structure of a light-emitting element according to the first embodiment.

FIG. 9 is a diagram schematically illustrating another example of a layered structure of a light-emitting element ES according to the present embodiment.

As illustrated in FIG. 9, the light-emitting element ES may have a configuration in which the anode electrode 41, the HTL 42, the EML 43, and the cathode electrode 45 are layered in this order from the thin film transistor layer 3 side. Also in this case, similar advantageous effects to those described above can be obtained.

Second Modified Example

Figure 10:
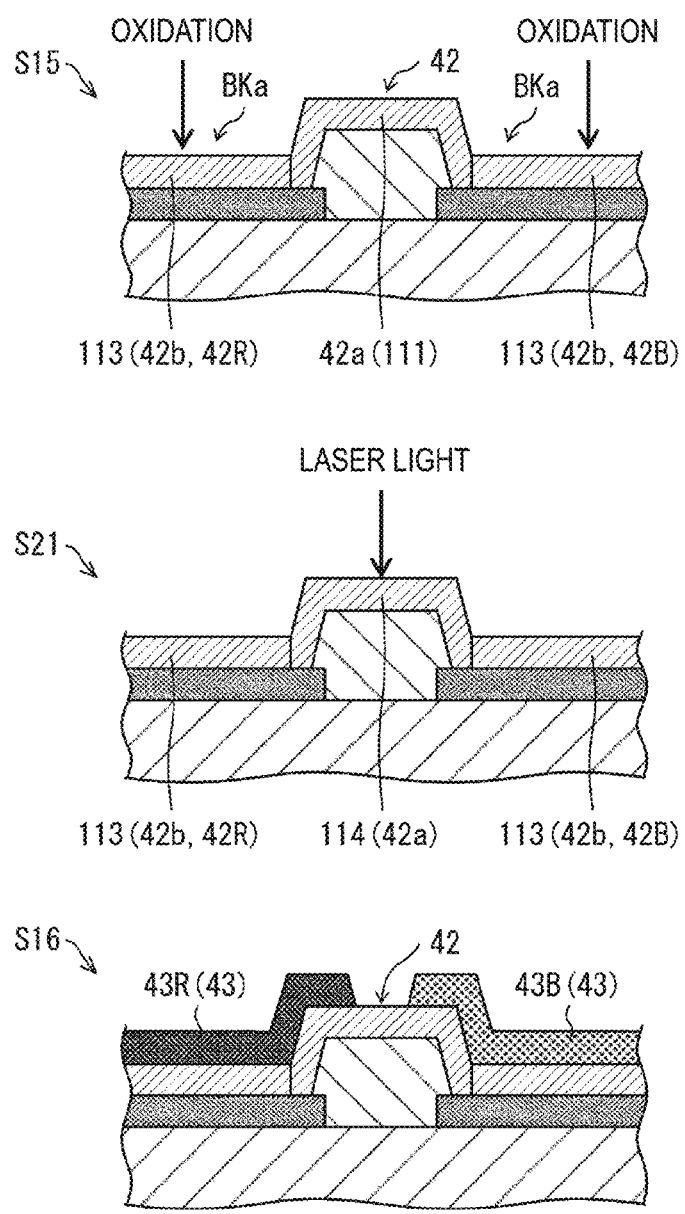
FIG. 10 illustrates cross-sectional views of several steps of forming a light-emitting element layer in a display device according to a second modified example of the first embodiment in order of steps.

In FIG. 5, as illustrated in S15, a case in which the adjacent pixel hole blocking section 42a is part of the organic insulating film 111, and is made of the organic insulating material (resin) used for the organic insulating film 111 has been described as an example. However, as described above, the hole blocking material forming the adjacent pixel hole blocking section 42a may be an electron transport material. FIG. 10 illustrates cross-sectional views of several steps of forming the light-emitting element layer 4 in the display device 1 according to the present modified example in order of steps. FIG. 10 illustrates the several manufacturing steps after the manufacturing steps illustrated in FIG. 4 in order of steps. Note that FIG. 10 also illustrates cross sections corresponding to part of the cross section taken along a line B-B' illustrated in FIG. 2.

In the present modified example, as illustrated in S15 in FIG. 10, after steps S11 to S14, step S15, which is the same as step S15 illustrated in FIG. 5, is performed.

Subsequently, as illustrated in S21 in FIG. 10, by irradiating the adjacent pixel hole blocking section 42a made of the organic insulating film 111 with laser light, the organic insulating film 111 in the adjacent pixel hole blocking section 42a is converted into a graphene film 114 (step S21, first transformation step, first adjacent pixel hole blocking section transformation step). Thus, the adjacent pixel hole blocking section 42a made of graphene film 114 having electron transport properties is formed.

Note that a method of converting the organic insulating film 111 in the adjacent pixel hole blocking section 42a into the graphene film 114 is the same as the method of converting the organic insulating film 111 in each pixel P (specifically in the opening BKa in the bank BK) into the graphene film 112 in step S14 illustrated in FIG. 4. Therefore, a description of the method of converting the organic insulating film 111 in the adjacent pixel hole blocking section 42a into the graphene film 114 is omitted.

Subsequently, as illustrated in S16 in FIG. 10, step S16, which is the same as step S16 illustrated in FIG. 5, is performed to form the EML 43 for each pixel P on the HTL 42 provided with the adjacent pixel hole blocking section 42a and the hole transport section 42b. Thereafter, by performing steps S17 and S18 illustrated in FIG. 5, the light-emitting element layer 4 including the light-emitting elements ES in which the adjacent pixel hole blocking section 42a is made of the electron transport material is formed.

Third Modified Example

In the second modified example, by chemically transforming the organic insulating material into the hole transport material and the electron transport material, respectively, the hole transport section 42b made of the hole transport material and the adjacent pixel hole blocking section 42a made of the electron transport material are formed. However, the present embodiment is not limited to this example.

In the present modified example, a case in which by converting (transforming) part of a film made of a hole transport material into an electron transport film by a chemical reaction, the hole transport section 42b made of a hole transport material and the adjacent pixel hole blocking section 42a made of an electron transport material will be described as an example.

Figure 11:
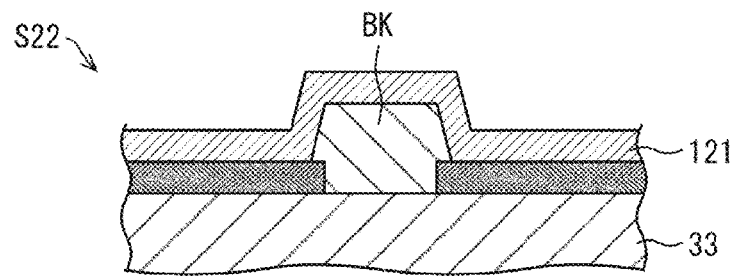
FIG. 11 illustrates cross-sectional views of an example of several steps of forming a light-emitting element layer in a display device according to a third modified example of the first embodiment in order of steps.
Figure 11:
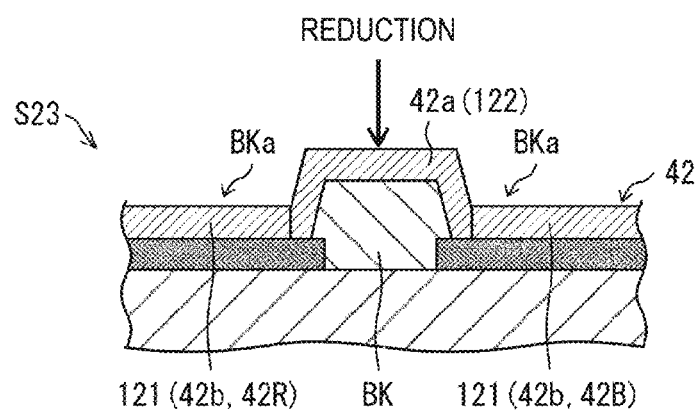
Figure 11:
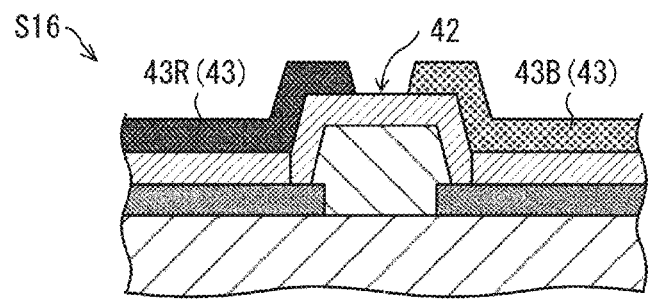

FIG. 11 illustrates cross-sectional views of several steps of forming the light-emitting element layer 4 in the display device 1 according to the present modified example in order of steps. FIG. 11 illustrates the several manufacturing steps after step S12 illustrated in FIG. 4. Note that FIG. 11 also illustrates cross sections corresponding to part of the cross section taken along a line B-B' illustrated in FIG. 2.

In the example illustrated in FIG. 11, after steps S11 to S12 illustrated in FIG. 4, as illustrated in S22 in FIG. 11, on the anode electrodes 41 and the bank BK, a hole transport film made of a hole transport material that is converted into a material having electron transport properties by a chemical reaction is formed in solid-like over all the pixels P (step S22, first film formation step).

Examples of the hole transport material include graphene oxide. As previously mentioned, graphene oxide is converted into graphene having electron transport properties by reduction (reduced graphene oxide).

In the following, a case in which the hole transport film is a graphene oxide film 121 will be described as an example. Any of various known methods can be used for forming the graphene oxide film 121, and the method is not limited to any specific method. The graphene oxide film 121 can be formed, for example, by applying a solution obtained by dissolving the graphene oxide in a solvent by a known coating method such as spin coating or spray coating, and drying the applied solution. The graphene oxide film 121 may be a film obtained by oxidizing graphene as described above. For example, after forming the organic insulating film 111 on the anode electrodes 41 and the bank BK in the same manner as in step S13 illustrated in FIG. 4, the graphene oxide film 121 may be formed by converting the organic insulating film 111 into grapheme by laser irradiation and further oxidizing the obtained graphene. A graphene film formed by growing graphene may be oxidized, as illustrated in a fourth modified example described later.

Subsequently, as illustrated in S23 in FIG. 11, the graphene oxide film 121 between the light-emitting elements ES in the adjacent pixels P is selectively reduced by, for example, irradiating with a femtosecond laser. Thus, the graphene oxide film 121 between the light-emitting elements ES is converted into a graphene film 122 (reduced graphene oxide film) (step S23, first transformation step). Thus, the HTL 42 having the adjacent pixel hole blocking section 42a made of the graphene film 122 having electron transport properties and the hole transport section 42b made of the graphene oxide film 121 having hole transport properties is formed.

Subsequently, as illustrated in S16 in FIG. 11, step S16, which is the same as step S16 illustrated in FIG. 5, is performed to form the EML 43 for each pixel P on the HTL 42 provided with the adjacent pixel hole blocking section 42a and the hole transport section 42b. Thereafter, by performing steps S17 and S18 illustrated in FIG. 5, the light-emitting element layer 4 including the light-emitting elements ES in which the adjacent pixel hole blocking section 42a is made of the electron transport material is formed.

Note that in the present modified example, as described above, a case in which, for example, a femtosecond laser is used for the reduction of the graphene oxide film 121 has been described as an example. However, the method of reducing the graphene oxide film 121 is not limited as long as part of the graphene oxide film 121 can be selectively reduced.

Fourth Modified Example

In the present modified example, a case in which by converting (transforming) part of a film made of an electron transport material into a hole transport film by a chemical reaction, the hole transport section 42b made of a hole transport material and the adjacent pixel hole blocking section 42a made of an electron transport material will be described as an example.

Figure 12:
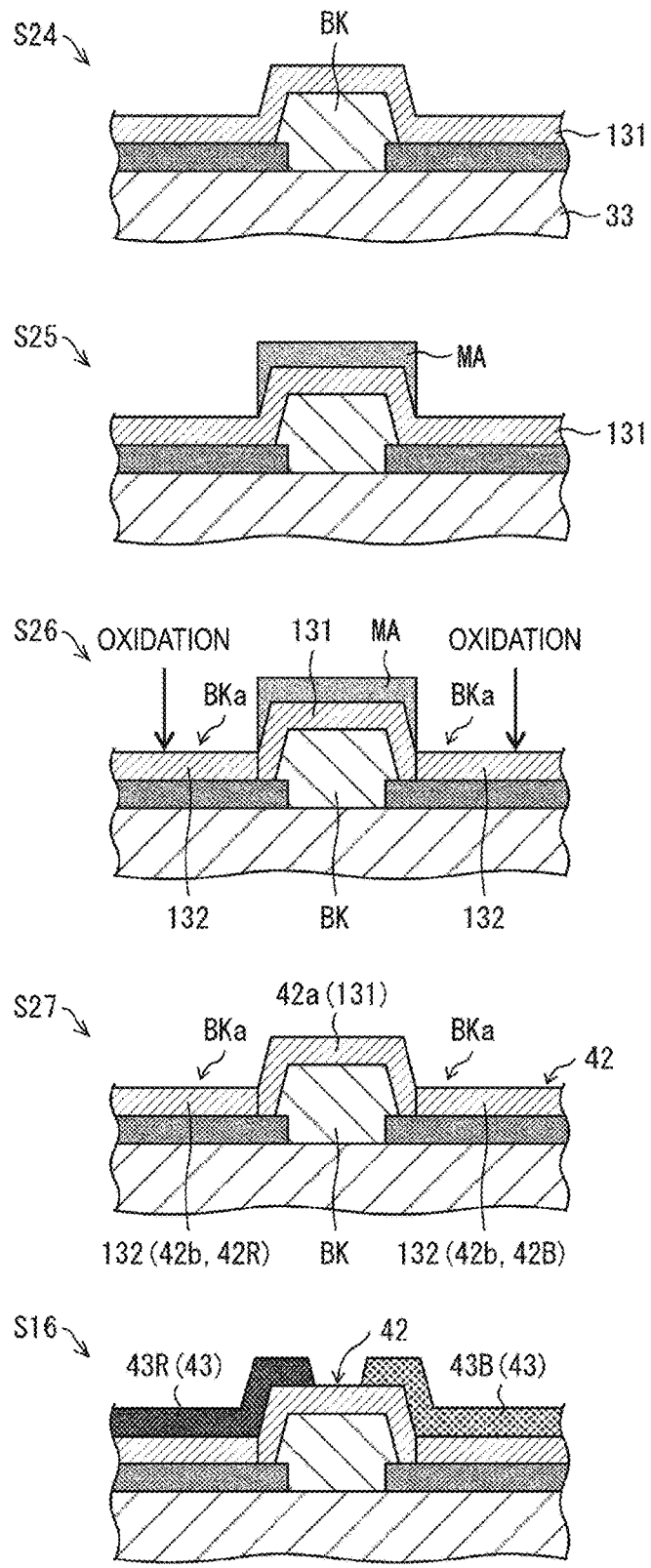
FIG. 12 illustrates cross-sectional views of another example of several steps of forming a light-emitting element layer in a display device according to a fourth modified example of the first embodiment in order of steps.

FIG. 12 illustrates cross-sectional views of an example of several steps of forming the light-emitting element layer 4 in the display device 1 according to the present modified example in order of steps. FIG. 12 illustrates the several manufacturing steps after step S12 illustrated in FIG. 4. Note that FIG. 12 also illustrates cross sections corresponding to part of the cross section taken along a line B-B' illustrated in FIG. 2.

In the example illustrated in FIG. 12, after steps S11 to S12 illustrated in FIG. 4, as illustrated in S24 in FIG. 12, on the anode electrodes 41 and the bank BK, an electron transport film made of an electron transport material that is converted into a material having hole transport properties by a chemical reaction is formed in solid-like over all the pixels P (step S24, first film formation step).

Examples of the electron transport material include graphene. As previously mentioned, graphene is converted into graphene oxide having hole transport properties by oxidation.

In the following, a case in which the electron transport film is a graphene film 131 will be described as an example. Any of various known methods can be used for forming the graphene film 131, and the method is not limited to any specific method. The graphene film 131 may be, for example, a film derived from an organic insulating film as described above. For example, after forming the organic insulating film 111 on the anode electrodes 41 and the bank BK in the same manner as in step S13 illustrated in FIG. 4, the graphene film 131 may be formed by irradiating the entire organic insulating film 111 with a laser to transform into graphene. The graphene film 131 can also be formed directly on a substrate to be processed by growing graphene on the substrate to be processed, for example, using remote microwave plasma to dissociate a carbon-containing gas as a source gas for film formation. The graphene film can also be formed by forming a support on a graphene film grown on a catalyst, etching away the catalyst, and then transferring the graphene film to a target substrate by removing the support.

Subsequently, part of the graphene film 131 is selectively oxidized to convert the graphene film 131 in each pixel P (specifically, in the opening BKa in the bank BK) into a graphene oxide film 132.

Specifically, for example, as illustrated in S25 in FIG. 12, a mask M made of, for example, polymethyl methacrylate (PMMA) is formed on the graphene film 131 by photolithography, covering the graphene film 131 between the light-emitting elements ES and having mask openings MA that expose the graphene film 131 in the openings BKa in the bank BK, (step S25, first transformation step).

Subsequently, as illustrated in S26 in FIG. 12, part of the graphene film 131 exposed through the mask openings MA is subjected to, for example, $UV/O_3$ treatment. Thus, the part of the graphene film 131 exposed through the mask openings MA is selectively oxidized and selectively converted into the graphene oxide film 132 (step S26, first transformation step).

Thereafter, as illustrated in S27 in FIG. 12, the mask M is removed (step S27, first transformation step). For example, acetone or the like can be used for removing the mask M. Thus, the adjacent pixel hole blocking section 42a made of the graphene film 131 having electron transport properties and the hole transport section 42b made of the graphene oxide film 132 having hole transport properties are formed.

Subsequently, as illustrated in S16 in FIG. 12, step S16, which is the same as step S16 illustrated in FIG. 5, is performed to form the EML 43 for each pixel P on the HTL 42 provided with the adjacent pixel hole blocking section 42a and the hole transport section 42b. Thereafter, by performing steps S17 and S18 illustrated in FIG. 5, the light-emitting element layer 4 including the light-emitting elements ES in which the adjacent pixel hole blocking section 42a is made of the electron transport material is formed.

Note that in the present modified example, as described above, a case in which the graphene film 131 is oxidized by, for example, UV/O$_3$ treatment has been described as an example. However, the method of oxidizing the graphene film 131 is not limited as long as part of the graphene film 131 can be selectively oxidized.

Any of various known methods described above can be used for oxidizing graphene to obtain graphene oxide. The oxidation method is not limited as long as the oxidation conditions are set so that the graphene film 131 remains between the openings BKa in the bank BK adjacent to each other. Partial oxidation of the graphene film 131 may be performed, for example, by selectively dropping a solution containing an oxidant onto the graphene film 131 using a mask. Prior to partial oxidation, a surface of the graphene film 131 may be partially modified by, for example, partially irradiating the graphene film 131 with UV light or the like. By partially modifying the surface of the graphene film 131 to partially impart water repellency or hydrophilicity, the oxidation region can be controlled.

Fifth Modified Example

The adjacent pixel hole blocking section 42*a* and the hole transport section 42*b* may be patterned such that they are chemically bonded to finally form a single layer. In the present modified example, a case in which the hole transport section 42*b* and the adjacent pixel hole blocking section 42*a* are patterned with separate materials will be described as an example.

Figure 13:
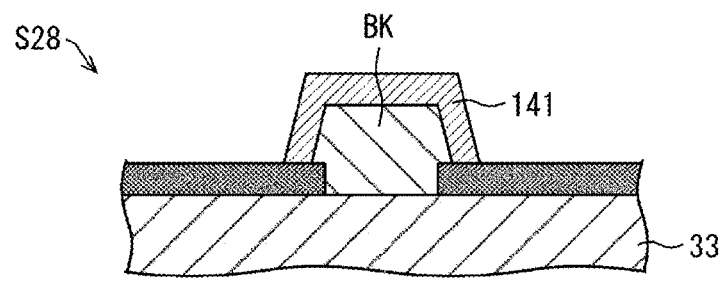
FIG. 13 illustrates cross-sectional views of another example of several steps of forming a light-emitting element layer in a display device according to a fifth modified example of the first embodiment in order of steps.
Figure 13:
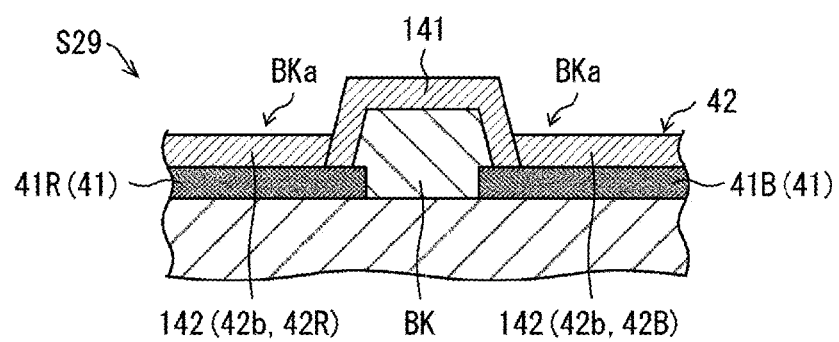
Figure 13:
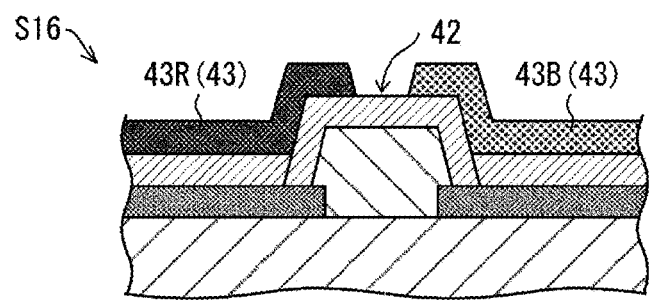

FIG. 13 illustrates cross-sectional views of several steps of forming the light-emitting element layer 4 in the display device 1 according to the present modified example in order of steps. FIG. 13 illustrates the several manufacturing steps after step S12 illustrated in FIG. 4. Note that FIG. 13 also illustrates cross sections corresponding to part of the cross section taken along a line B-B' illustrated in FIG. 2.

In the example illustrated in FIG. 13, after steps S11 to S12 illustrated in FIG. 4, as illustrated in S28 in FIG. 13, a film 141 made of a hole blocking material is patterned on the bank BK between the adjacent pixels P as the adjacent pixel hole blocking section 42*a* (step S28, step of patterning a carrier transport section). The film 141 made of the hole blocking material may be an organic insulating material or an electron transport material. In this case, any of the various materials described above can be used for the organic insulating material or the electron transport material.

A method of patterning the film 141 made of the hole blocking material is not limited to any specific method, and for example, any of the patterning methods (1) to (5) described above can be used.

When the film 141 made of the hole blocking material is a graphene film, the graphene film may be a film obtained by converting an organic insulating film, or a graphene film obtained by reducing a graphene oxide film (reduced graphene oxide film).

When the film 141 made of the hole blocking material is a film obtained by converting an organic insulating film into a graphene film, a patterned organic insulating film may be converted into a graphene film, or after converting a solid-like organic insulating film into a graphene film, the obtained graphene film may be patterned.

For example, after step S13 illustrated in FIG. 4, the entire solid-like organic insulating film 111 formed in step S13 may be converted into a graphene film and then the graphene film may be patterned, or the solid-like organic insulating film 111 may be patterned and then converted into a graphene film.

When the patterned organic insulating film is converted into the graphene film, a film made of an organic insulating material such as PI may be formed on the bank BK by, for example, a soft nanoimprint method, and then the organic insulating material may be transformed into graphene by laser irradiation.

Similarly, when the film 141 made of the hole blocking material is a reduced graphene oxide film obtained by reducing the graphene oxide film, the patterned graphene oxide film may be reduced to graphene. Alternatively, after the entire solid-like graphene oxide film is reduced, the obtained reduced graphene oxide film may be patterned.

As an example, a reduction method in an aqueous solution is shown below. For example, first, a substrate on which a graphene oxide film (100 mg) is formed is immersed in water (minimum 100 mL). Subsequently, hydrazine (1.00 mL, 32.1 mmol) is dissolved in the water and heated at 100° C. for 24 hours for reduction reaction. Note that during the reduction reaction, it is desirable to use a capacitor in order to circulate hydrazine that has changed to gas and continue the reduction reaction with graphene oxide. Thereafter, the substrate is washed five times with, for example, 100 mL of water, and then washed with 100 mL of methanol five times. After washing, the substrate is dried in a vacuum heating environment. Thus, the reduced graphene oxide film can be formed. Note that, as described above, the graphene oxide film may be pre-patterned, or may be patterned after reduction.

A known patterning technique such as photolithography or laser processing can be used for the patterning.

In the present modified example, after patterning the film 141 made of the hole blocking material in this manner, a film 142 made of a hole transport material is patterned as the hole transport section 42*b* as illustrated in S29 in FIG. 13 (step S29, step of patterning an adjacent pixel carrier blocking section). At this time, the film 142 made of the hole transport material is patterned so as to cover the anode electrode 41 in each pixel P (specifically, a region surrounded by the film 141 made of the hole blocking material). Any of various materials described above can be used for the hole transport material.

A method of patterning the film 142 made of the hole transport material is not limited to any specific method. Also in this case, for example, any of the patterning methods (1) to (5) described above can be used.

Thus, the adjacent pixel hole blocking section 42*a* made of the film 141 made of the hole blocking material and the hole transport section 42*b* made of the film 142 made of the hole transport material are formed.

Subsequently, as illustrated in S16 in FIG. 13, step S16, which is the same as step S16 illustrated in FIG. 5, is performed to form the EML 43 for each pixel P on the HTL 42 provided with the adjacent pixel hole blocking section 42*a* and the hole transport section 42*b*. Thereafter, by performing steps S17 and S18 illustrated in FIG. 5, the light-emitting element layer 4 including the light-emitting elements ES in which the adjacent pixel hole blocking section 42*a* is made of the electron transport material is formed.

The adjacent pixel hole blocking section 42*a* made of the film 141 made of the hole blocking material and the hole transport section 42*b* made of the film 142 made of the hole transport material formed according to the present modified example, are chemically bonded to each other at a portion where the adjacent pixel hole blocking section 42*a* and the hole transport section 42*b* are in contact with each other. Thus, according to the method described above, it is possible to form the HTL 42 in which the adjacent pixel hole blocking section 42a and the hole transport section 42b are integrally formed in the same layer.

Note that in the present modified example, a case of patterning the adjacent pixel hole blocking section 42a and then patterning the hole transport section 42b has been described as an example. However, the present modified example is not limited thereto, and after patterning the hole transport section 42b, the adjacent pixel hole blocking section 42a may be patterned.

Sixth Modified Example

In the present embodiment, a case in which the display device 1 includes three types of light-emitting elements RES, GES, and BES that emit red light, green light, and blue light, respectively, has been described as an example. However, the present embodiment is not limited thereto, and may include four or more types of light-emitting elements that emit light of different colors from each other, or may include two types of light-emitting elements.

Second Embodiment

Another embodiment of the disclosure will be described below with reference to FIGS. 14 to 18. Note that differences from the first embodiment will be described in the present embodiment. For convenience of description, members having the same functions as the members described in the first embodiment are designated by the same reference signs, and descriptions thereof are omitted.

Figure 14:
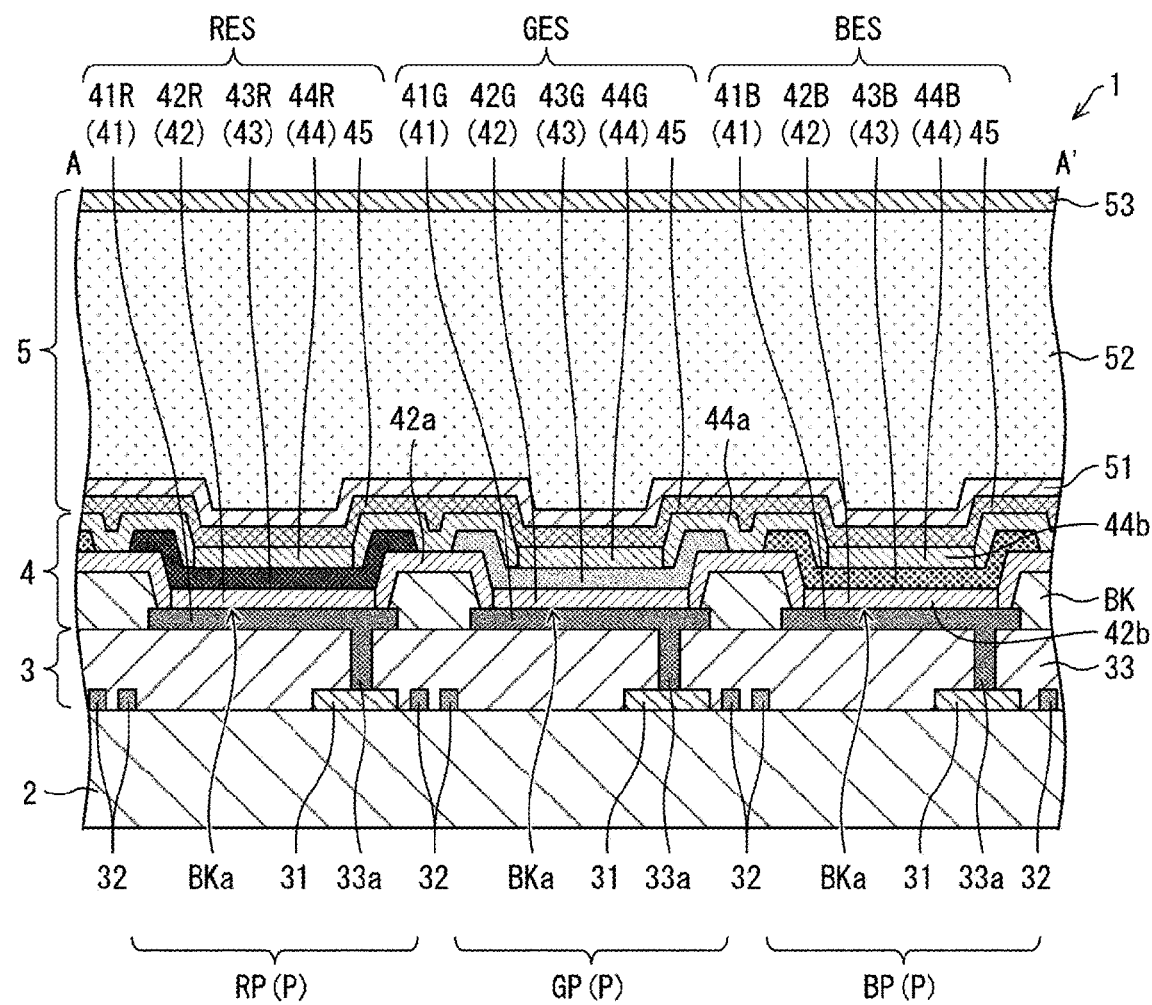
FIG. 14 is a cross-sectional view illustrating an example of a schematic configuration of a pixel in a display device according to a second embodiment.

FIG. 14 is a cross-sectional view illustrating an example of a schematic configuration of a pixel P in a display device 1 according to the present embodiment. A partially enlarged plan view illustrating an example of a schematic configuration of the display device 1 according to the present embodiment is the same as FIG. 2. FIG. 14 corresponds to the cross-sectional view taken along a line A-A' illustrated in FIG. 2.

The display device 1 illustrated in FIG. 14 has the same configuration as the display device 1 according to the first embodiment, except for the points described below. In the display device 1 illustrated in FIG. 14, an ETL 44 includes an electron transport section 44b as a carrier transport section and an adjacent pixel electron blocking section 44a as an adjacent pixel carrier blocking section. That is, in the display device 1 according to the present embodiment, an HTL 42 and the ETL 44 include the carrier transport sections and the adjacent pixel carrier blocking sections, respectively.

The electron transport section 44b has electron transport properties. The electron transport section 44b is provided overlapping an EML 43 in each light-emitting element ES for each tight-emitting element ES, and transports electrons as carriers to the EML 43.

The adjacent pixel electron blocking section 44a is provided in a portion between the light-emitting elements ES in adjacent pixels P, and blocks transportation of electrons between the light-emitting elements ES in the adjacent pixels P. Note that a size of the adjacent pixel electron blocking section 44a is not limited as long as the adjacent pixel electron blocking section 44a is provided between the electron transport sections 44b in the adjacent pixels P to enable blocking of transportation of electrons between the light-emitting elements ES in the adjacent pixels P.

The electron transport section 44b and the adjacent pixel electron blocking section 44a can be formed, for example, by transforming at least part of a common layer provided in common to all the pixels P by a chemical reaction. The electron transport section 44b and the adjacent pixel electron blocking section 44a formed in this manner are chemically bonded to each other and are formed integrally with each other in the same layer. Further, the electron transport section 44b and the adjacent pixel electron blocking section 44a have, suitably, substantially the same thickness by transforming at least part of the common layer provided in common to all the pixels P by a chemical reaction as described above.

The electron transport section 44b is made of an electron transport material. On the other hand, the adjacent pixel electron blocking section 44a is made of an electron blocking material that blocks transportation of electrons. As the electron blocking material, for example, an organic insulating material can be used. Note that the electron blocking material may be a hole transport material.

The electron transport section 44b may be formed by forming a film of an electron transport material, or may be formed by converting (transforming) an organic insulating material or a hole transport material into an electron transport material by a chemical reaction. Thus, the electron transport section 44b may be formed by transforming an electron blocking material used for the adjacent pixel electron blocking section 44a by a chemical reaction.

The adjacent pixel electron blocking section 44a may be formed by forming a film of an organic insulating material or a hole transport material, or may be formed by converting (transforming) an organic insulating material or an electron transport material into a hole transport material by a chemical reaction.

However, the present embodiment is not limited to the above configuration. The electron transport section 44b and the adjacent pixel electron blocking section 44a may be patterned with separate materials.

When the electron transport section 44b and the adjacent pixel electron blocking section 44a are patterned with separate materials, the patterning can be performed by any of the following methods, for example.

For example, when the materials of the electron transport section 44b and the adjacent pixel electron blocking section 44a are powders (solids), examples of the patterning method include (1) a method of separate patterning with vapor deposition using a fine metal mask (FMM), (2) an ink-jet method, (3) a method of transferring the above material into pixels RP, GP, and BP using silicon rubbers having patterns corresponding to the pixels RP, GP, and BP.

When the materials of the electron transport section 44b and the adjacent pixel electron blocking section 44a are liquids, examples of the patterning method include the method (2) described above, the method (3) described above, and (4) a method performing photolithography after applying the above materials onto the entire surface of the substrate, and (5) a method of laser processing.

In a case in which the electron transport section 44b and the adjacent pixel electron blocking section 44a are patterned separately, when at least one of the electron transport section 44b and the adjacent pixel electron blocking section 44a is subjected to conversion (transformation) of the material, the conversion (transformation) of the material may be performed after patterning the section to be subjected to the conversion (transformation) of the material, or may be performed after patterning both the electron transport section 44b and the adjacent pixel electron blocking section 44a. When the film formation and patterning are performed separately, the conversion (transformation) of the above material may be performed after patterning, or may be performed after film formation and before patterning.

When forming the electron transport section 44b and the adjacent pixel electron blocking section 44a by transforming at least part of the common layer by a chemical reaction as described above, the electron transport section 44b and the adjacent pixel electron blocking section 44a are chemically bonded to each other by covalent bonds.

On the other hand, when the electron transport section 44b and the adjacent pixel electron blocking section 44a are patterned with separate materials, the electron transport section 44b and the adjacent pixel electron blocking section 44a are chemically bonded to each other by, for example, intermolecular forces (van der Waals forces) or hydrogen bonds between chemical substances of the materials to form a single integrated layer. Also in this case, the adjacent pixel electron blocking section 44a formed integrally with the electron transport sections 44b is provided between the adjacent electron transport sections 44b in the same layer.

As the electron transport material, for example, at least one electron transport material selected from the group consisting of the electron transport materials exemplified in the first embodiment can be used.

As the organic insulating material, for example, at least one organic insulating material selected from the group consisting of the organic insulating materials exemplified in the first embodiment can be used.

As the hole transport material, for example, at least one hole transport material selected from the group consisting of the hole transport materials exemplified in the first embodiment can be used.

As described above, the electron transport section 44b can be formed, for example, by transforming the electron blocking material by a chemical reaction. As described in the first embodiment, organic insulating materials such as PI, PEI, and PAN have sufficient heat resistance and contain carbon so that the organic insulating materials are converted into graphene by exposure to laser light. As described in the first embodiment, graphene oxide is converted into graphene by reduction (reduced graphene oxide). Thus, the electron transport material may be graphene derived from an organic insulating material (derived graphene) or graphene obtained by reducing graphene oxide (reduced graphene oxide).

As described above, the adjacent pixel electron blocking section 44a may be formed by, for example, transforming an electron transport material by a chemical reaction. As described in the first embodiment, graphene has electron transport properties, but is converted into graphene oxide having hole transport properties by an oxidation reaction.

Thus, for example, by converting part of the common layer made of the organic insulating material or the hole transport material into an electron transport material, the electron transport section 44b made of the electron transport material and the adjacent pixel electron blocking section 44a made of the organic insulating material or the hole transport material that is not converted into the electron transport material can be integrally formed in the same layer.

For example, by converting part of the common layer made of the electron transport material into a hole transport material, the adjacent pixel electron blocking section 44a made of the hole transport material and the electron transport section 44b made of the electron transport material that is not converted into the hole transport material can be integrally formed in the same layer.

A thickness of the ETL 44 is more preferably 1 nm or more for adjusting the carrier balance between electrons and positive holes. When the thickness of the ETL 44 exceeds 30 nm, the mobility of electrons slows down, so the drive voltage of the display device 1 tends to increase. Thus, the thickness of the ETL 44 is more preferably 30 nm or less.

Note that the electron transport section 44b and the adjacent pixel electron blocking section 44a preferably have substantially the same thickness as described above, but they may have different thicknesses from each other. In a case in which the electron transport section 44b is formed by transforming an organic insulating material by a chemical reaction, when a thickness of part of the organic insulating material that is not transformed is within a range of 0.5 nm to 3 nm, it is possible to transport electrons to the EML 43 by a tunneling effect. Thus, when the thickness of the ETL 44 has a thickness of greater than 3 nm at which the tunneling effect is not expressed, and the thickness of the part of the organic insulating material that is not transformed is within the range of 0.5 nm to 3 nm at which the tunneling effect is expressed, the electron transport section 44b may be provided only on the surface of the ETL 44.

As illustrated in FIG. 14, a light-emitting element RES according to the present embodiment includes an anode electrode 41R, an HTL 42R, an EML 43R, an ETL 44R, and a cathode electrode 45. A light-emitting element GES includes an anode electrode 41G, an HTL 42G, an EML 43G, an ETL 44G, and the cathode electrode 45. A light-emitting element BES includes an anode electrode 41B, an HTL 42B, an EML 43B, an ETL 44B, and the cathode electrode 45. The ETL 44R is the electron transport section 44b of the ETL 44 in the pixel RP. The ETL 44G is the electron transport section 44b of the ETL 44 in the pixel GP. The ETL 44B is the electron transport section 44b of the ETL 44 in the pixel BP.

Method for Manufacturing Display Device 1

Next, a method for manufacturing the display device 1 will be described, focusing on the points different from the first embodiment.

Figure 15:
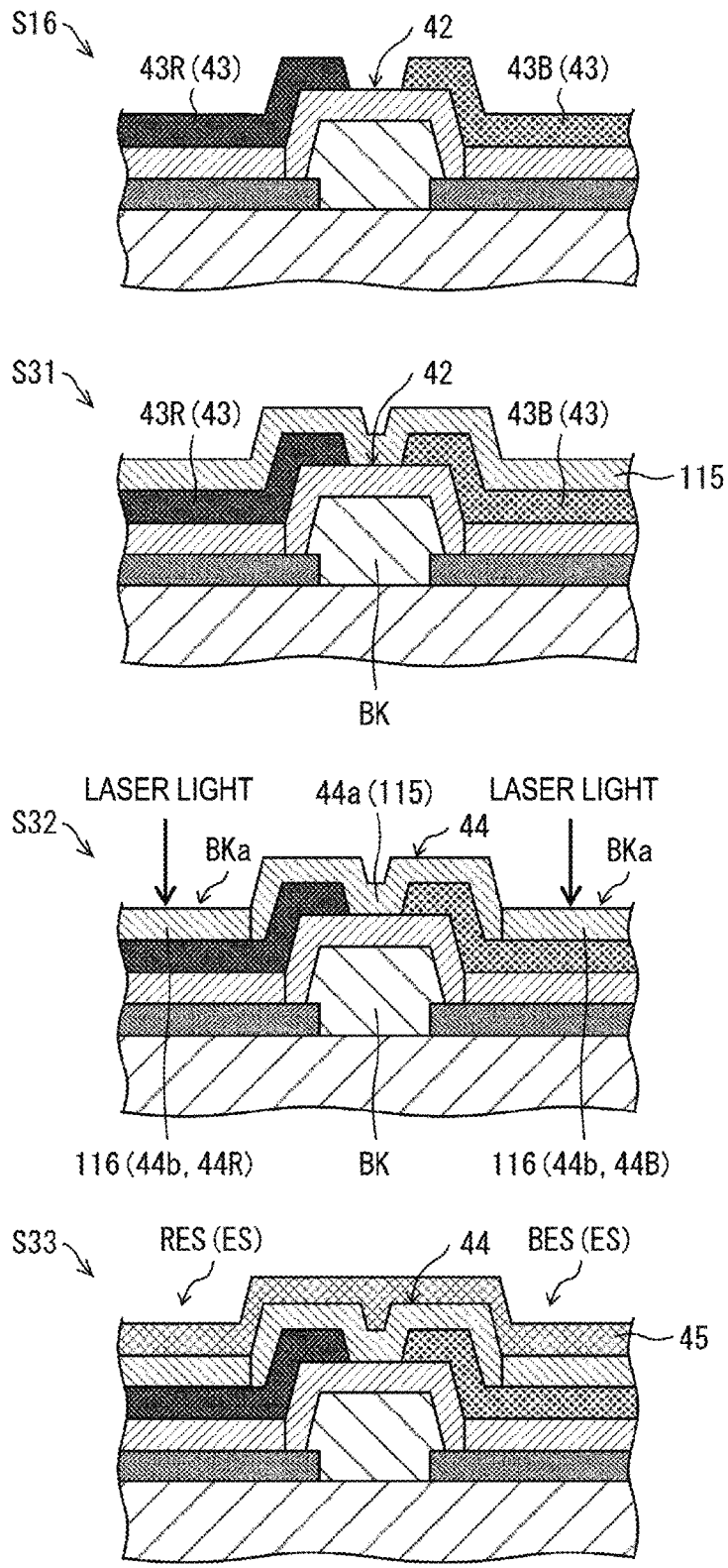
FIG. 15 illustrates cross-sectional views of several steps of forming a light-emitting element layer in the display device according to the second embodiment in order of steps.

FIG. 15 illustrates other cross-sectional views of several manufacturing steps after step S15 illustrated in FIG. 5 in order of steps. Note that FIG. 15 also illustrates cross sections corresponding to part of the cross section taken along a line B-B' illustrated in FIG. 2.

In the following, a case of forming the electron transport section 44b and the adjacent pixel electron blocking section 44a by transforming at least part of an organic insulating film provided in common to all the pixels P as the common layer by a chemical reaction will be described as an example.

In the present embodiment, as illustrated in S16 in FIG. 15, after steps S11 to S14, step S16, which is the same step as step S16 illustrated in FIG. 5, is performed. In the present embodiment, in place of steps S17 and S18 illustrated in FIG. 5, the following steps S31 to S33 are performed.

That is, in the present embodiment, after step S16, first, as illustrated in S31 in FIG. 15, an organic insulating material that is converted into a material having electron transport properties by a chemical reaction is formed as a solid-like film on the HTL 42 so as to cover the EML 43 over all the pixels P. Thus, a solid-like organic insulating film 115 is formed (step S31, second film forming step).

In the following, a case in which a resin that serves as a graphene precursor material that is converted into graphene by exposure to laser light is used for the organic insulating film 115 will be described as an example. The same material used for the organic insulating film 111 can be used for the organic insulating film 115. In this case, a method of forming the organic insulating film 115 is the same as the method of forming the organic insulating film 111 in step S13. Thus, a description of the method of forming the organic insulating film 115 is omitted here.

Subsequently, as illustrated in S32 in FIG. 15 by selectively irradiating only each pixel P (specifically, the opening BKa in the bank BK) with laser light, the organic insulating film 115 in each pixel P is converted into graphene. Thus, a graphene film 116 is formed in each pixel P, and the adjacent pixel electron blocking section 44a made of the organic insulating film 115 is formed between the adjacent pixels P to block the transportation of electrons between the light-emitting elements ES in the pixels P (step S32, second transformation step, second carrier transport section transformation step).

Subsequently, as illustrated in S33 in FIG. 15, the cathode electrode 45 is formed as an upper electrode on the ETL 44 provided with the adjacent pixel electron blocking section 44a and the electron transport section 44b (step S33, step of forming an upper electrode). Note that a method of forming the cathode electrode 45 on the ETL 44 is the same as the method of forming the cathode electrode 45 on the ETL 44 in step S18 illustrated in FIG. 5.

Thus, the light-emitting element layer 4 including the plurality of light-emitting elements ES is formed on the flattening film 33. Thus, in the display device 1, the HTL 42 and the ETL 44 may include the carrier transport sections and the adjacent pixel carrier blocking sections, respectively.

First Modified Example

In FIG. 15, as illustrated in S32, a case in which the adjacent pixel electron blocking section 44a is part of the organic insulating film 115, and is made of the organic insulating material (resin) used for the organic insulating film 115 has been described as an example. However, as previously mentioned, the electron blocking material forming the adjacent pixel electron blocking section 44a may be a hole transport material.

In the present modified example, a case in which by converting (transforming) part of a film made of a hole transport material into an electron transport film by a chemical reaction, the adjacent pixel electron blocking section 44a made of a hole transport material and the electron transport section 44b made of an electron transport material will be described as an example.

Figure 16:
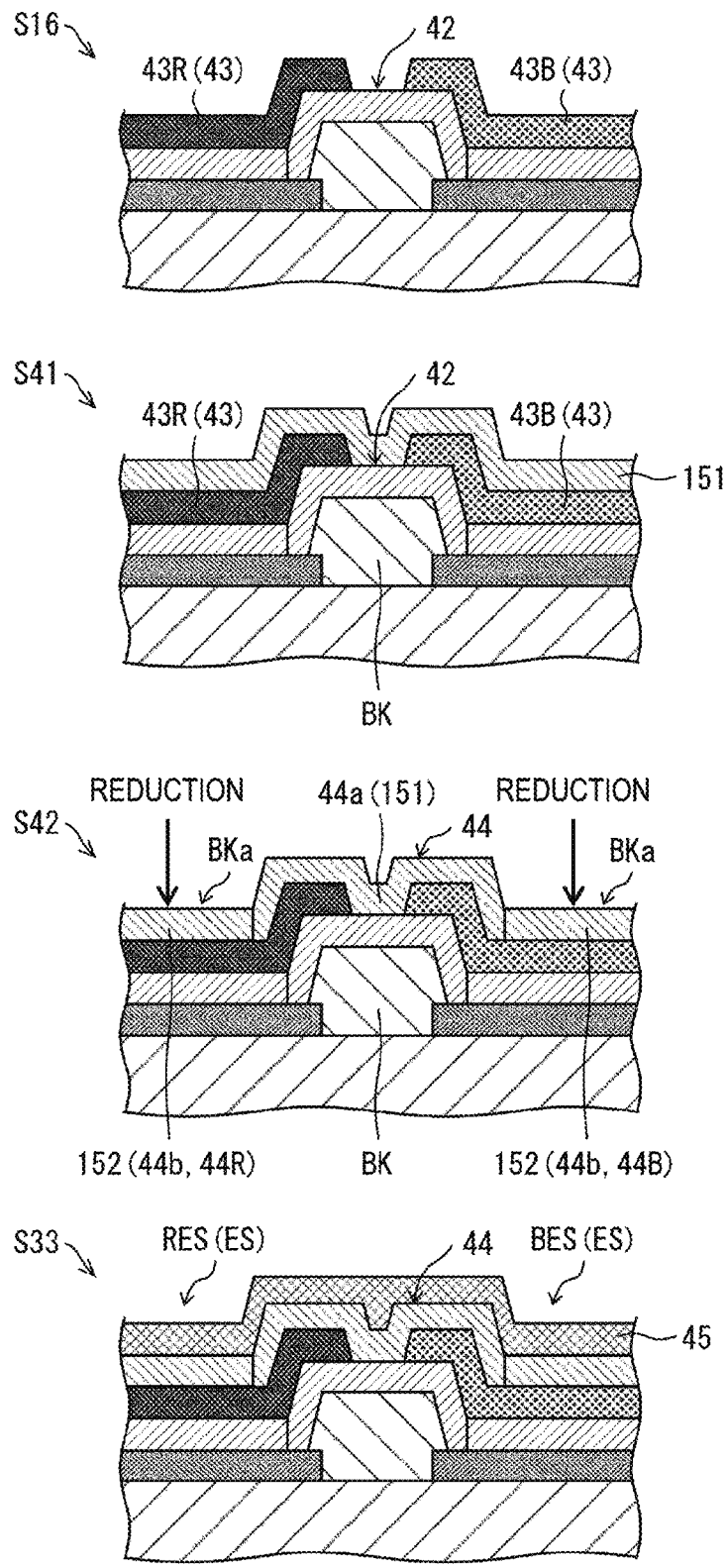
FIG. 16 illustrates cross-sectional views of another example of several steps of forming a light-emitting element layer in a display device according to a first modified example of the second embodiment in order of steps.

FIG. 16 illustrates cross-sectional views of several steps of forming the light-emitting element layer 4 in the display device 1 according to the present modified example in order of steps. FIG. 16 illustrates the several manufacturing steps after step S15 illustrated in FIG. 5. Note that FIG. 16 also illustrates cross sections corresponding to part of the cross section taken along a line B-B' illustrated in FIG. 2.

In the example illustrated in FIG. 16, after step S16, which is the same as step S16 illustrated in FIG. 15, as illustrated in S41 in FIG. 16, a hole transport film made of a hole transport material that is converted into a material having electron transport properties by a chemical reaction is formed on the HTL 42 so as to cover the EML 43 in solid-like over all the pixels P (step S41, second film forming step).

Examples of the hole transport material include graphene oxide as described above. In the following, a case in which the hole transport film is a graphene oxide film 151 will be described as an example. In this case, a method of forming the graphene oxide film 151 is the same as the method of forming the graphene oxide film 121 in step S22 in the first embodiment. Thus, a description of the method of forming the graphene oxide film 151 is omitted here.

Subsequently, as illustrated in S42 in FIG. 16, the graphene oxide film 151 in each pixel P (specifically in the opening BKa in the bank BK) is selectively reduced by, for example, irradiating with a femtosecond laser. Thus, the graphene oxide film 151 in each pixel P is converted into a graphene film 152 (reduced graphene oxide film) (step S42, second film forming step, second carrier transport section transformation step). Thus, the adjacent pixel electron blocking section 44a made of the graphene oxide film 151 having hole transport properties and the electron transport section 44b made of the graphene film 152 having electron transport properties are formed.

Subsequently, as illustrated in S33 in FIG. 16, step S33, which is the same as step S33 illustrated in FIG. 15, is performed to form the cathode electrode 45 as the upper electrode on the ETL 44 provided with the adjacent pixel electron blocking section 44a and the electron transport section 44b. Thus, the light-emitting element layer 4 according to the present modified example is formed.

Note that in the present modified example, as described above, a case in which, for example, a femtosecond laser is used for the reduction of the graphene oxide film 151 has been described as an example. However, the method of reducing the graphene oxide film 151 is not limited as long as part of the graphene oxide film 151 can be selectively reduced.

Second Modified Example

In the present modified example, a case in which by converting (transforming) part of a film made of an electron transport material into a hole transport film by a chemical reaction, the adjacent pixel electron blocking section 44a made of a hole transport material and the electron transport section 44b made of an electron transport material will be described as an example.

Figure 17:
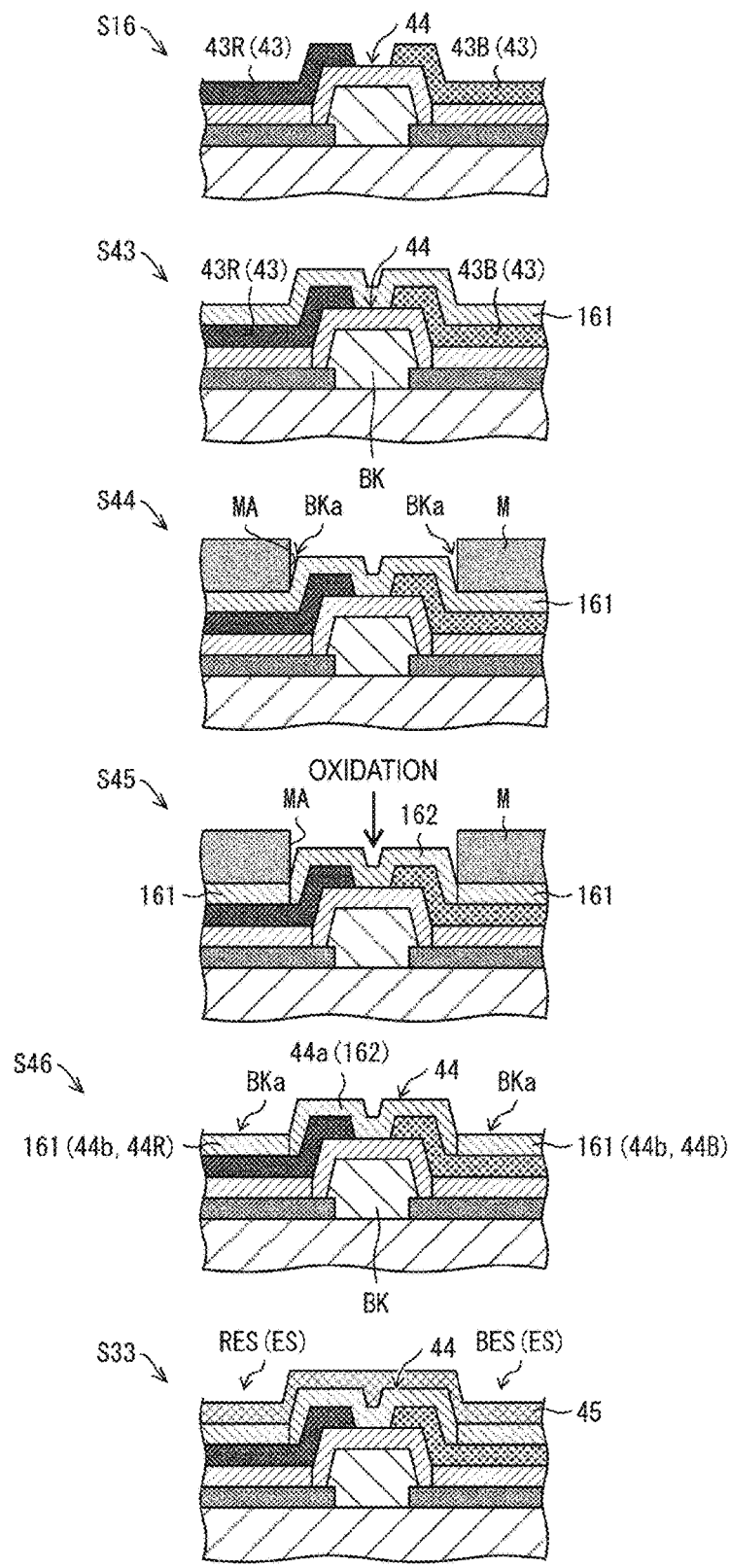
FIG. 17 illustrates cross-sectional views of another example of several steps of forming a light-emitting element layer in a display device according to a second modified example of the second embodiment in order of steps.

FIG. 17 illustrates cross-sectional views of an example of several steps of forming the light-emitting element layer 4 in the display device 1 according to the present modified example in order of steps. FIG. 17 illustrates the several manufacturing steps after step S15 illustrated in FIG. 5. Note that FIG. 17 also illustrates cross sections corresponding to part of the cross section taken along a line B-B' illustrated in FIG. 2.

In the example illustrated in FIG. 17, after step S16, which is the same as in step S16 illustrated in FIG. 15, as illustrated in S43 in FIG. 17, an electron transport film made of an electron transport material that is converted into a material having hole transport properties by a chemical reaction is formed on the HTL 42 so as to cover the EML 43 in solid-like over all the pixels P (step S43, second film forming step).

Examples of the electron transport material include graphene as described above. In the following, a case in which the electron transport film is a graphene film 161 will be described as an example. In this case, a method of forming the graphene film 161 is the same as the method of forming the graphene film 131 in step S24 in the first embodiment. Thus, a description of the method of forming the graphene film 161 is omitted.

Subsequently, part of the graphene film 161 is selectively oxidized to convert the graphene film 161 between the light-emitting elements ES in the adjacent pixels P into a graphene oxide film 162.

Specifically, for example, as illustrated in S44 in FIG. 17, a mask M made of, for example, PMMA is formed on the graphene film 161 by photolithography, covering the graphene film 131 in the openings BKa in the bank BK and having mask openings MA that expose the graphene film 161 between the light-emitting elements ES (step S44, second transformation step).

Subsequently, as illustrated in S45 in FIG. 17, part of the graphene film 161 exposed through the mask openings MA is subjected to, for example, $UV/O_3$ treatment. Thus, the part of the graphene film 161 exposed through the mask openings MA is selectively oxidized and selectively converted into the graphene oxide film 162 (step S45, second transformation step).

Thereafter, as illustrated in S46 in FIG. 17, the mask M is removed (step S46, second transformation step). For example, acetone or the like can be used for removing the mask M. Thus, the adjacent pixel electron blocking section 44a made of the graphene oxide film 162 having hole transport properties and the electron transport section 44b made of the graphene film 161 having electron transport properties are formed.

Subsequently, as illustrated in S33 in FIG. 17, step S33, which is the same as step S33 illustrated in FIG. 15, is performed to form the cathode electrode 45 as the upper electrode on the ETL 44 provided with the adjacent pixel electron blocking section 44a and the electron transport section 44b. Thus, the light-emitting element layer 4 according to the present modified example is formed.

Note that in the present modified example, as described above, a case in which the graphene film 161 is oxidized by, for example, $UV/O_3$ treatment has been described as an example. However, the method of oxidizing the graphene film 161 is not limited as long as part of the graphene film 161 can be selectively oxidized.

Third Modified Example

The adjacent pixel electron blocking section 44a and the electron transport section 44b may be patterned such that they are chemically bonded to finally form a single layer. In the present modified example, a case in which the adjacent pixel electron blocking section 44a and the electron transport section 44b are patterned with separate materials will be described as an example.

Figure 18:
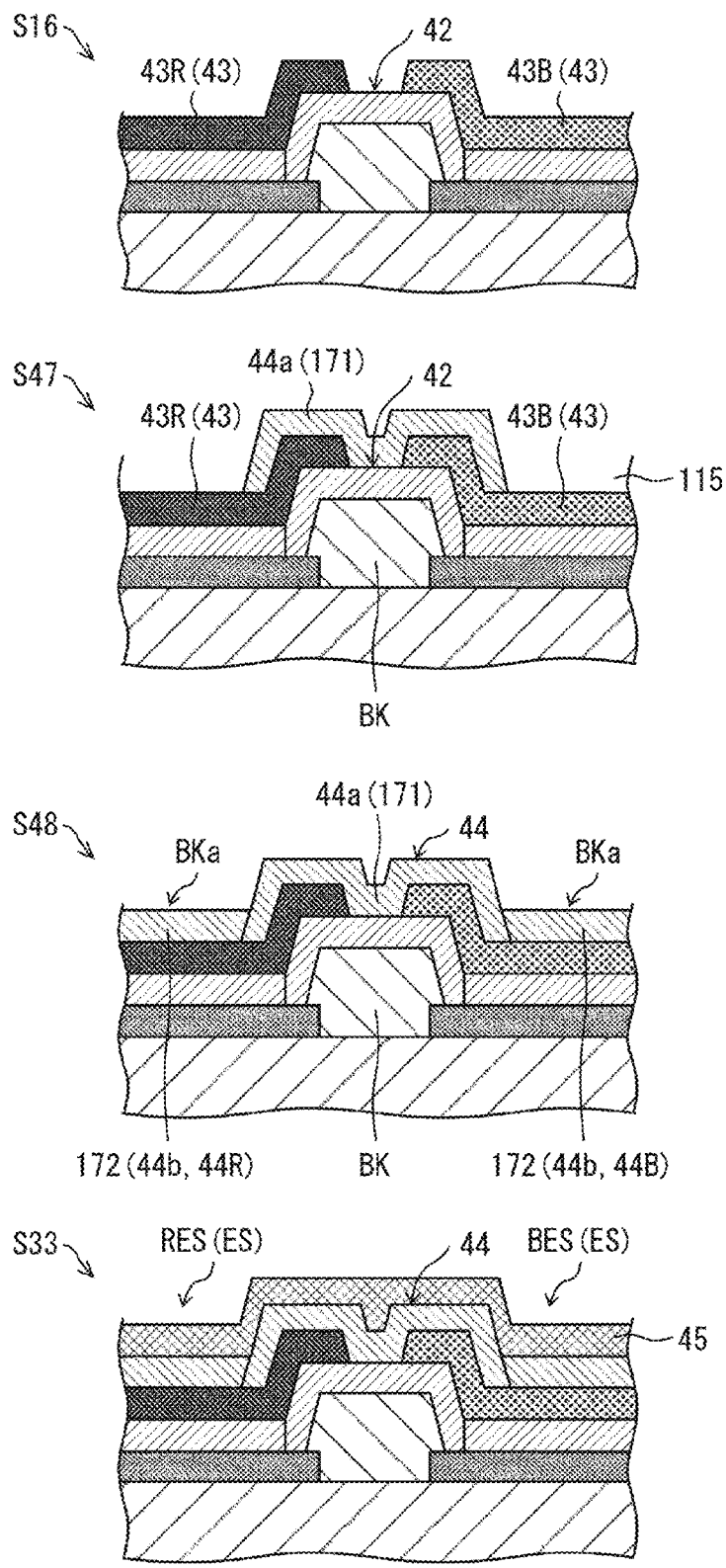
FIG. 18 illustrates cross-sectional views of another example of several steps of forming a light-emitting element layer in a display device according to a third modified example of the second embodiment in order of steps.

FIG. 18 illustrates cross-sectional views of several steps of forming the light-emitting element layer 4 in the display device 1 according to the present modified example in order of steps. FIG. 18 illustrates the several manufacturing steps after step S15 illustrated in FIG. 5. Note that FIG. 18 also illustrates cross sections corresponding to part of the cross section taken along a line B-B' in FIG. 2.

In the example illustrated in FIG. 18, after step S16, which is the same as step S16 illustrated in FIG. 15, as illustrated in S47 in FIG. 18, a film 171 made of an electron blocking material is patterned on the bank BK between the adjacent pixels P as the adjacent pixel electron blocking section 44a (step S47, step of patterning a carrier transport section). The film 171 made of the electron blocking material may be an organic insulating material or a hole transport material. In this case, any of various materials described above can be used for the organic insulating material or the hole transport material.

A method of patterning the film 171 made of the electron blocking material is not limited to any specific method, and for example, any of the patterning methods (1) to (5) described above can be used.

Note that when the film 171 made of the electron blocking material is, for example, a graphene oxide film obtained by oxidizing a graphene film, a patterned graphene film may be oxidized, or after oxidizing a solid-like graphene film, the obtained graphene oxide film may be patterned. Similarly, when the film 171 made of the electron blocking material is, for example, a graphene oxide film obtained by converting an organic insulating film into graphene, and then oxidizing the obtained graphene film, the order of oxidation of the graphene film obtained by converting the organic insulating film and the patterning are not limited. For example, after patterning the organic insulating film, the oxidation of the graphene film obtained by converting the organic insulating film may be performed, or after oxidizing the graphene film obtained by converting the organic insulating film, the obtained graphene oxide film may be patterned. Alternatively, patterning of the graphene film may be performed between the conversion of the organic insulating film into graphene and the oxidation of the graphene film.

A known patterning technique such as photolithography or laser processing can be used for the patterning.

In the present modified example, after patterning the film 171 made of the electron blocking material in this manner, a film 172 made of an electron transport material is patterned as the electron transport section 44b as illustrated in S48 in FIG. 18 (step S48, step of patterning an adjacent pixel carrier blocking section). At this time, the film 172 made of the electron transport material is patterned so as to cover the EML 43 in each pixel P (specifically, the region surrounded by the film 171 made of the electron blocking material). Any of various materials described above can be used for the electron transport material.

A method of patterning the film 172 made of the electron transport material is not limited to any specific method. Also in this case, for example, any of the patterning methods (1) to (5) described above can be used.

Thus, the adjacent pixel electron blocking section 44a made of the film 171 made of the electron blocking material and the electron transport section 44b made of the film 172 made of the electron transport material are formed.

Subsequently, as illustrated in S33 in FIG. 17, step S33, which is the same as step S33 illustrated in FIG. 15, is performed to form the cathode electrode 45 as the upper electrode on the ETL 44 provided with the adjacent pixel electron blocking section 44a and the electron transport section 44b. Thus, the light-emitting element layer 4 according to the present modified example is formed.

The adjacent pixel electron blocking section 44a made of the film 171 made of the electron blocking material and the electron transport section 44b made of the film 172 made of the electron transport material formed according to the present modified example, are chemically bonded to each other at a portion where the adjacent pixel electron blocking section 44a and the electron transport section 44b are in contact with each other. Thus, according to the method described above, it is possible to form the ETL 44 in which the adjacent pixel electron blocking section 44a and the electron transport section 44b are integrally formed in the same layer.

Note that in the present modified example, a case of patterning the adjacent pixel electron blocking section 44a and then patterning the electron transport section 44b has been described as an example. However, the present modified example is not limited thereto, and after patterning the electron transport section 44b, the adjacent pixel electron blocking section 44a may be patterned.

Third Embodiment

Still another embodiment of the disclosure will be described below with reference to FIGS. 19 to 23. Note that differences from the first and the second embodiments will be described in the present embodiment. For convenience of description, members having the same functions as the members described in the first and second embodiments are designated by the same reference signs, and descriptions thereof are omitted.

Figure 19:
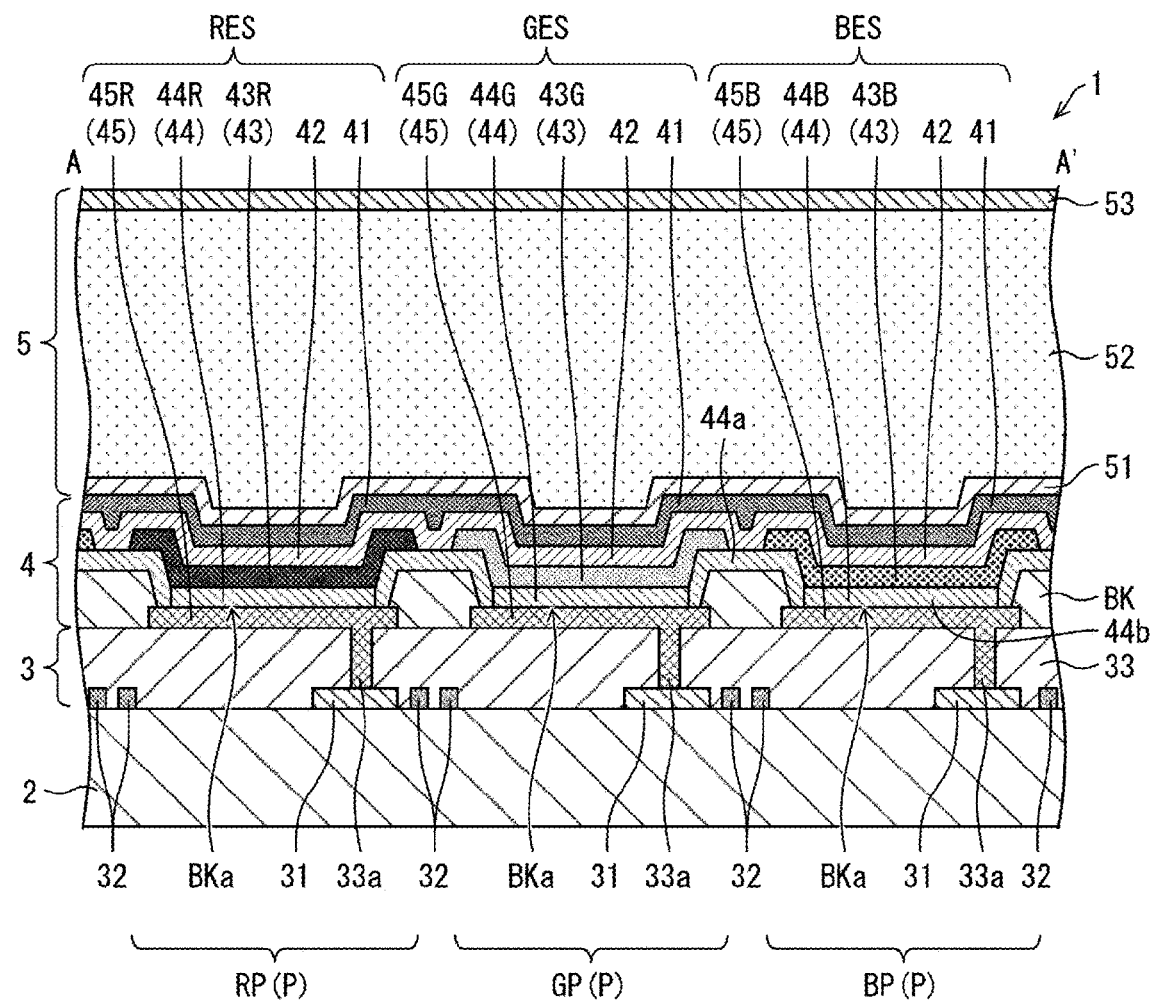
FIG. 19 is a cross-sectional view illustrating an example of a schematic configuration of a pixel in a display device according to a third embodiment.

FIG. 19 is a cross-sectional view illustrating an example of a schematic configuration of a pixel P in a display device 1 according to the present embodiment. A partially enlarged plan view illustrating an example of a schematic configuration of the display device 1 according to the present embodiment is the same as FIG. 2. FIG. 19 corresponds to the cross-sectional view taken along a line A-A' illustrated in FIG. 2.

The display device 1 illustrated in FIG. 19 has the same configuration as the display device 1 according to the first embodiment, except for the points described below. A light-emitting element layer 4 of the display device 1 illustrated in FIG. 19 has a configuration in which a cathode electrode 45, a bank BK, an ETL 44, an EML 43, an HTL 42, and an anode electrode 41 are layered in this order from a thin film transistor layer 3 side. Thus, in the present embodiment, the ETL 44 is a first carrier transport layer and the HTL 42 is a second carrier transport layer. As illustrated in FIG. 19, in the first and second embodiments, the layering order from the anode electrode 41 to the cathode electrode 45 in the light-emitting element ES may be reversed.

Note that as described in the first embodiment, of the anode electrode 41 and the cathode electrode 45, at least the electrode on the light extraction surface side needs to have optical transparency. On the other hand, the electrode on the side opposite to the light extraction surface may have optical transparency or light reflectivity.

Thus, in the present embodiment, for example, when the display device 1 is a top-emission display device, the anode electrode 41, which is an upper electrode, is formed of a light transmissive electrode made of an optical transparent material, and the cathode electrode 45, which is a lower electrode, is formed of a light-reflective electrode made of a light-reflective material. On the other hand, when the display device 1 is a bottom-emission display device, the anode electrode 41, which is the upper electrode, is formed of a light-reflective electrode made of a light-reflective material, and the cathode electrode 45, which is the lower electrode, is formed of a light transmissive electrode made of an optical transparent material.

In the display device 1 illustrated in FIG. 19, of the ETL 44 and the HTL 42, the ETL 44 includes an electron transport section 44b as a carrier transport section and an adjacent pixel electron blocking section 44a as an adjacent pixel carrier blocking section.

Note that the electron transport section 44b and the adjacent pixel electron blocking section 44a are the same as the electron transport section 44b and the adjacent pixel electron blocking section 44a described in the second embodiment. Thus, the description thereof is omitted in the present embodiment.

Note that in the present embodiment, a known hole transport material can be used for the HTL 42. As the hole transport material, for example, at least one hole transport material selected from the group consisting of the hole transport materials exemplified in the first embodiment can be used.

A light-emitting element RES illustrated in FIG. 19 includes a cathode electrode 45R, an ETL 44R, an EML 43R, the HTL 42, and the anode electrode 41. A light-emitting element GES includes a cathode electrode 45G, an ETL 44G, an EML 43G, the HTL 42, and the anode electrode 41. A light-emitting element BES includes a cathode electrode 45B, an ETL 44B, an EML 43B, the HTL 42, and the anode electrode 41.

Step of Forming Light-Emitting Element Layer 4

Steps of forming the light-emitting element layer 4 will be described below as a difference from the first embodiment.

Figure 20:
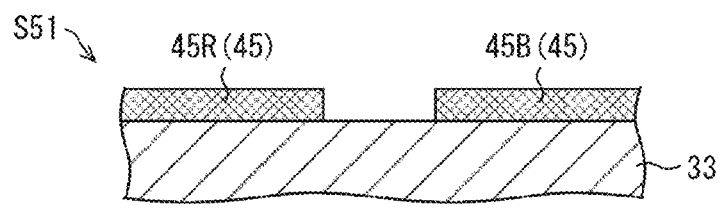
FIG. 20 illustrates cross-sectional views of several steps of forming a light-emitting element layer in the display device according to the third embodiment in order of steps.
Figure 20:
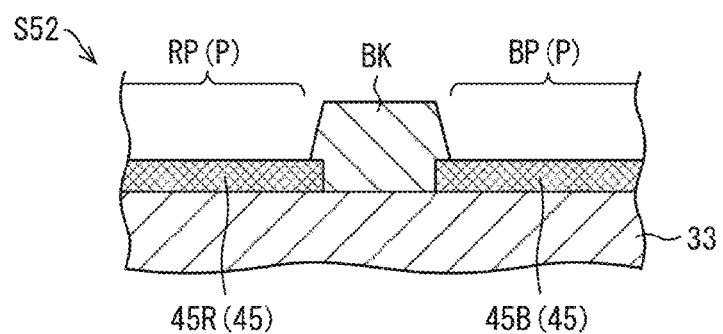
Figure 20:
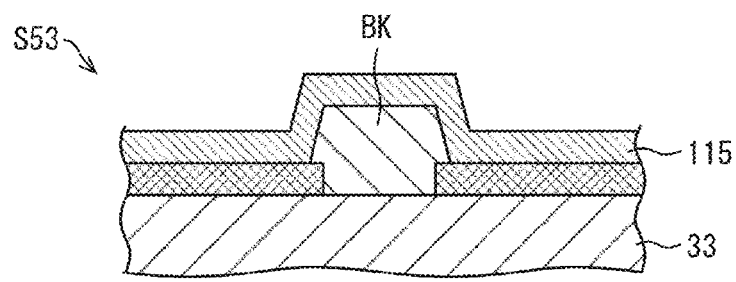
Figure 20:
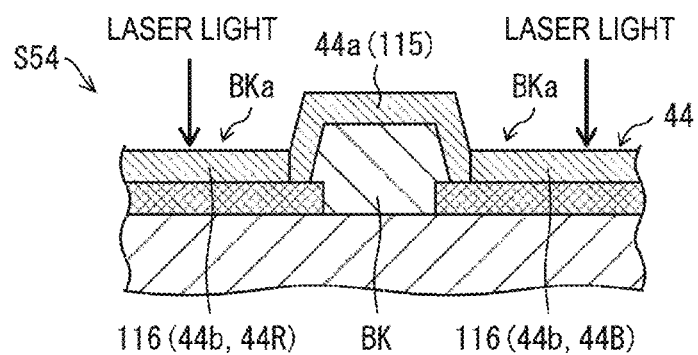
Figure 21:
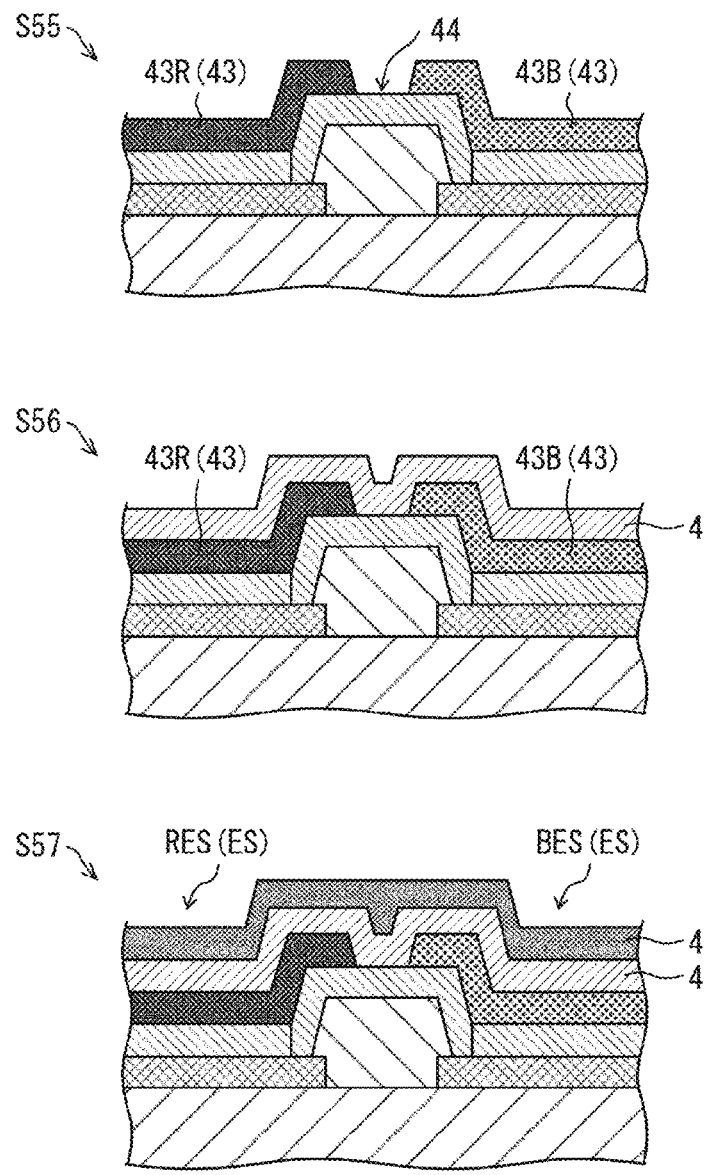
FIG. 21 illustrates other cross-sectional views of several steps of forming the light-emitting element layer in the display device according to the third embodiment in order of steps.

FIGS. 20 and 21 each illustrate cross-sectional views of several steps of forming the light-emitting element layer 4 in step S2 in order of steps. FIG. 21 illustrates the manufacturing steps after the manufacturing steps illustrated in FIG. 20. Note that FIGS. 20 and 21 illustrate cross sections corresponding to part of the cross section taken along a line B-B' illustrated in FIG. 2. Step S2 includes steps S51 to S54 illustrated in FIG. 20 and steps S55 to S57 illustrated in FIG. 21.

In step S2, first, as illustrated in S51 in FIG. 20, the cathode electrode 45 is patterned as the lower electrode on a flattening film 33 in a thin film transistor layer 3 in an island shape for each pixel P (step S51, step of forming a lower electrode). A method similar to the method of forming the cathode electrode 45 according to the first embodiment can be used to form the cathode electrode 45.

Subsequently, as illustrated in S52 in FIG. 20, the bank BK that serves as the pixel separation film is formed on the flattening film 33 so as to cover the pattern edges of the cathode electrodes 45 in the respective pixels P (step S52). A method similar to the method of forming the bank BK according to the first embodiment can be used to form the bank BK.

Subsequently, as illustrated in S53 in FIG. 20, on the cathode electrodes 45 and the bank BK, an organic insulating film 115 is formed by applying an organic insulating material that is converted into a material having electron transport properties by a chemical reaction in solid-like over all the pixels P (step S53, first film forming step).

In the following, a case in which a resin that serves as a graphene precursor material that is converted into graphene by exposure to laser light is used for the organic insulating film 115, as in the second embodiment, will be described as an example. In this case, a method of forming the organic insulating film 115 is the same as in step S31 in the second embodiment.

Subsequently, as illustrated in S54 in FIG. 20, by selectively irradiating only each pixel P (specifically, an opening BKa in the bank BK) with laser light, the organic insulating film 115 in each pixel P is converted into graphene. Thus, a graphene film 116 is formed in each pixel P, and the adjacent pixel electron blocking section 44a made of the organic insulating film 115 is formed between the adjacent pixels P to block transportation of electrons between the light-emitting elements ES in the pixels (step S54, first transformation step).

Subsequently, as illustrated in S55 in FIG. 21, the EML 43 is formed for each pixel P, on the ETL 44 provided with the adjacent pixel electron blocking section 44a and the electron transport section 44b (step S55, step of forming a light-emitting layer). A method similar to the method of forming the EML 43 according to the first embodiment can be used to form the EML 43.

Subsequently, as illustrated in S56 in FIG. 21, the HTL 42 is formed on the EMLs 43 (step S56, step of forming a second carrier transport layer). Note that in the present embodiment, the HTL 42 is a common layer provided in common to all the pixels P as illustrated in FIG. 19, but the present embodiment is not limited thereto. In the present embodiment, similar to the EML 43, the HTL 42 may be formed in an island shape for each pixel P (in other words, for each light-emitting element ES) so as to cover at least the opening BKa in the bank BK corresponding to each pixel P. Any of various known methods for forming an HTL, such as vapor deposition and an ink-jet method, can be used to form the HTL 42.

Subsequently, as illustrated in S57 in FIG. 21, the anode electrode 41 is formed as the upper electrode on the HTL 42 (step S57, step of forming an upper electrode). Any of various known methods for forming an anode electrode, such as sputtering, a vacuum vapor deposition technique, CVD, plasma CVD, and a printing method, can be used to form the anode electrode 41.

Thus, the light-emitting element layer 4 including the plurality of light-emitting elements ES is formed on the flattening film 33.

Advantageous Effects

As illustrated in FIG. 19, the display device 1 according to the present embodiment is provided with the adjacent pixel electron blocking section 44a between the light-emitting elements ES in the adjacent pixels P, which blocks transportation of electrons between the light-emitting elements ES in the adjacent pixels P. Thus, in the present embodiment, the transportation of electrons to the light-emitting element ES in the adjacent pixel P is blocked. Thus, according to the present embodiment, it is possible to provide the display device 1 in which crosstalk does not occur.

In addition, according to the present embodiment, the electron transport section 44b and the adjacent pixel electron blocking section 44a are part of the ETL 44 that is the common layer. The ETL 44 and the display device 1 including the ETL 44 according to the present embodiment have a simpler processing process than a case in which the ETL 44 is formed in an island shape for each pixel P, thereby greatly reducing the manufacturing costs.

In particular, organic insulating materials used as graphene precursors are inexpensive compared to known electron transport materials, and have high temperature stability and high chemical stability. Thus, according to the present embodiment, it is possible to provide the display device 1 that is more reliable than a display device formed using a known electron transport material. Further, as previously mentioned, graphene and graphene oxide have fast carrier transport properties. Thus, according to the present embodiment, the drive voltage and power consumption of the display device 1 can be reduced, and thus the display time and standby time of the display device 1 can be lengthened.

In addition, known organic materials used for the ETL may have poor adhesion to other materials. However, according to the present embodiment, as described above, the electron transport section 44b and the adjacent pixel electron blocking section 44a are part of the ETL 44, which is the common layer, are chemically bonded to each other, and are integrally formed with each other in the same layer. Thus, according to the present embodiment, the adhesion between the materials used in the electron transport section 44b and the adjacent pixel electron blocking section 44a is high, thereby preventing foreign matters such as water or oxygen from penetrating from the outside. Thus, according to the present embodiment, it is possible to provide the display device 1 with higher reliability.

First Modified Example

Figure 22:
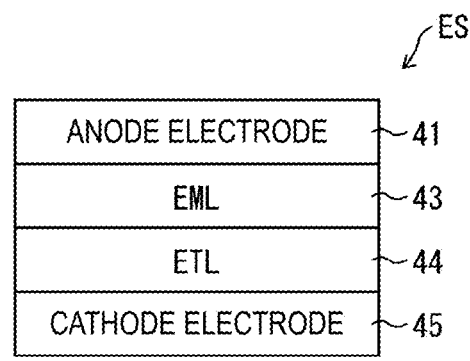
FIG. 22 is a diagram schematically illustrating another example of a layered structure of a light-emitting element according to the third embodiment.

FIG. 22 is a diagram schematically illustrating another example of a layered structure of a light-emitting element ES according to the present embodiment.

As illustrated in FIG. 22, the light-emitting element ES may have a configuration in which the cathode electrode 45, the ETL 44, the EML 43, and the anode electrode 41 are layered in this order from the thin film transistor layer 3 side. Also in this case, similar advantageous effects to those described above can be obtained.

Second Modified Example

Also in this embodiment, in the display device 1, the ETL 44 and the HTL 42 may include the carrier transport sections and the adjacent pixel carrier blocking sections, respectively.

Figure 23:
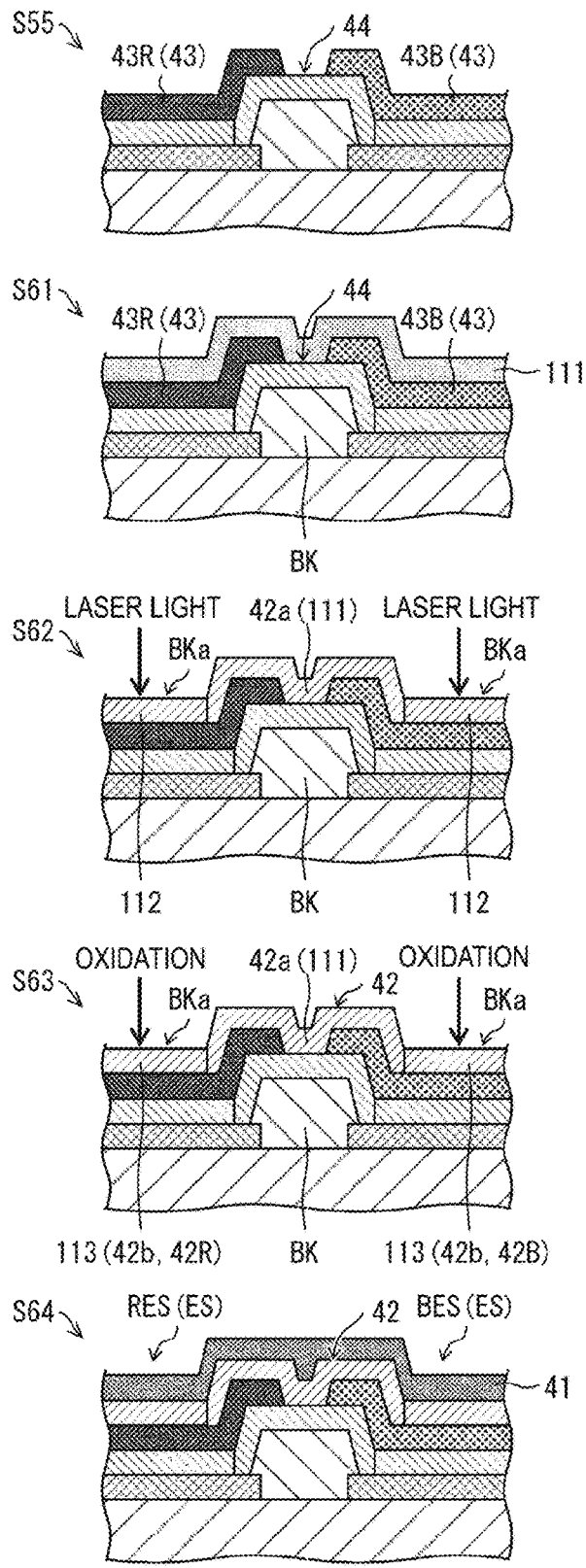
FIG. 23 illustrates still other cross-sectional views of several steps of forming the light-emitting element layer in the display device according to the third embodiment in order of steps.

FIG. 23 illustrates other cross-sectional views of several manufacturing steps after step S54 illustrated in FIG. 20 in order of steps. Note that FIG. 23 also illustrates cross sections corresponding to part of the cross section taken along a line B-B' illustrated in FIG. 2.

In the present modified example, as illustrated in S55 in FIG. 2423, after steps S51 to S54, step S55, which is the same as step S55 illustrated in FIG. 21, is performed. In the present modified example, in place of steps S56 to S57 illustrated in FIG. 21, the following steps S61 to S64 are performed.

In other words, in the present modified example, after step S55, first, as illustrated in S61 in FIG. 23, an organic insulating material that is finally converted into a material having hole transport properties by a chemical reaction is formed as a solid-like film on the ETL 44 so as to cover the EML 43 over all the pixels P. Thus, a solid-like organic insulating film 111 is formed (step S61).

In the following, a case of using the same organic insulating material as in the first embodiment for the organic insulating film 111 will be described as an example. In this case, a method of forming the organic insulating film 111 is the same as in step S13 in the first embodiment.

Subsequently, as illustrated in S62 in FIG. 23, by selectively irradiating only each pixel P (specifically, the opening BKa in the bank BK) with laser light, the organic insulating film 111 in each pixel P is converted into graphene. Thus, a graphene film 112 is formed in each pixel P, and the adjacent pixel hole blocking section 42a made of the organic insulating film 111 is formed between the adjacent pixels P to block transportation of positive holes between the light-emitting elements ES in the pixels (step S62).

Subsequently, as illustrated in S63 in FIG. 23, the graphene film 112 is oxidized to convert the graphene film 112 into a graphene oxide film 113 (step S63). Thus, the hole transport section 42b made of the graphene oxide film 113 can be formed in each pixel P. In this case, a method of oxidizing the graphene film 112 to convert the graphene film 112 into the graphene oxide film 113 is the same as in step S15 in the first embodiment, for example.

Subsequently, as illustrated in S64 in FIG. 23, the anode electrode 41 is formed as the upper electrode on the HTL 42 provided with the adjacent pixel hole blocking section 42a and the hole transport section 42b (step S64). A method similar to in step S57 illustrated in FIG. 21 can be used for forming the anode electrode 41.

Thus, the light-emitting element layer 4 including the plurality of light-emitting elements ES is formed on the flattening film 33.

Third Modified Example

Note that also in the present embodiment, the HTL 42 can be modified as in the modified examples illustrated in the first embodiment. Thus, the HTL 42 can be formed, for example, by the method illustrated in steps S15 and S21 illustrated in FIG. 10, the method illustrated in steps S22 to S23 illustrated in FIG. 11, the method illustrated in steps S24 to S27 illustrated in FIG. 12, or the method illustrated in steps S28 to S29 illustrated in FIG. 13. Also in the present embodiment, the ETL 44 can be modified as in the modified examples illustrated in the second embodiment. Thus, the ETL 44 can be formed, for example, by the method illustrated in steps S41 to S42 illustrated in FIG. 16, the method illustrated in steps S43 to S46 illustrated in FIG. 17, or the method illustrated in steps S47 to S48 illustrated in FIG. 18.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A display device having a plurality of pixels, the display device comprising:
a support body;
a thin film transistor layer;
a light-emitting element layer; and
a sealing layer in the stated order, the sealing layer configured to seal the light-emitting element layer,
wherein the light-emitting element layer includes a plurality of light-emitting elements having different luminescent colors from each other,
the plurality of light-emitting elements is formed, such that each of the plurality of light-emitting elements corresponds to a respective pixel in the plurality of pixels,
each of the plurality of light-emitting elements includes a lower electrode, an upper electrode, a light-emitting layer formed between the lower electrode and the upper electrode, a first carrier transport layer formed between the light-emitting layer and the lower electrode, and a second carrier transport layer formed between the light-emitting layer and the upper electrode,
the lower electrode and the light-emitting layer are formed in island shapes for each of the plurality of pixels,
at least the first carrier transport layer of the first and second carrier transport layers included in the light-emitting element is a common layer formed in common to the plurality of light-emitting elements in the plurality of pixels,
the at least the first carrier transport layer includes, for each of the plurality of pixels, a carrier transport section formed overlapping the light-emitting layer in each of the plurality of light-emitting elements and configured to transport carriers to the light-emitting layer, and an adjacent pixel carrier blocking section formed in a portion between the plurality of light-emitting elements in the plurality of pixels adjacent to each other and configured to block transportation of the carriers between the plurality of light-emitting elements in the plurality of pixels adjacent to each other,
the lower electrode is an anode electrode,
the upper electrode is a cathode electrode,
the first carrier transport layer is a hole transport layer,
the second carrier transport layer is an electron transport layer, and the electron transport layer is another common layer formed in common to the plurality of light-emitting elements in the plurality of pixels, and
the electron transport layer includes, for each of the plurality of pixels:
an electron transport section formed overlapping the light-emitting layer in each of the plurality of light-emitting elements and configured to transport electrons to the light-emitting layer, and
an adjacent pixel electron blocking section formed in a portion between the plurality of light-emitting elements in the plurality of pixels adjacent to each other and configured to block transportation of the electrons between the plurality of light-emitting elements in the plurality of pixels adjacent to each other.

2. The display device according to claim 1,
wherein the adjacent pixel carrier blocking section of the first carrier transport layer is an adjacent pixel hole blocking section configured to block transportation of positive holes between the plurality of light-emitting elements in the plurality of pixels adjacent to each other, and is made of an electron transport material.

3. The display device according to claim 2,
wherein the electron transport material is at least one electron transport material selected from the group consisting of graphene, tin(IV) oxide, zinc oxide, Tris (2,4,6-trimethyl-3-(pyridin-3-yl)phenyl)borane, 4,6-Bis(3,5-di(pyridin-3-yl)phenyl)-2-methylpyrimidine, 1,3-Bis(3,5-dipyrid-3-ylphenyl)benzene, 2,7-Bis(2,2'-bipyridin-5-yl)triphenylene, Lithium 8-quinolinolate, Poly[(9,9-bis(3'-((N,N-dimethyl)-N-ethylammonium)-propyl)-2,7-fluorene)-alt-2,7-(9, 9-dioctylfluorene)]dibromide, Poly[(9,9-bis(3'-(N,N-dimethylamino)propyl)-2,7-fluorene)-alt-2,7-(9,9-dioctylfluorene)], (1,3,5-Triazine-2,4,6-triyl)tris(benzene-3,1-diyl)tris (diphenylphosphine oxide), 2,5,8,11-Tetrakis(1,1-dimethylethyl)perylene, 1,3,5-Tris(3-pyridyl-3-phenyl) benzene, 1,3,5-Tris(1-phenyl-1H-benzimidazol-2-yl) benzene, Diphenyl[4-(triphenylsilyl)phenyl]phosphine oxide, 3,5-Diphenyl-4-(1-naphthyl)-1H-1,2,4-triazole, Tris(8-hydroxyquinoline)aluminum, 2,9-Dimethyl-4,7-diphenyl-1,10-phenanthroline, 4,7-Diphenyl-1,10-phenanthroline, 2,5-Bis(1-naphthyl)-1,3,4-oxadiazole, Bis(8-hydroxy-2-methylquinoline)-(4-phenylphenoxy) aluminum, 3,5-Bis(4-tert-butylphenyl)-4-phenyl-4H-1, 2,4-triazole, 2-(4-Biphenylyl)-5-phenyl-1,3,4-oxadiazole, 3-(Biphenyl-4-yl)-5-(4-tert-butylphenyl)-4-phenyl-4H-1,2,4-triazole, and 2-(4-tert-butylphenyl)-5-(4-biphenylyl)-1,3,4-oxadiazole.

4. The display device according to claim 1,
wherein the electron transport section is made of at least one electron transport material selected from the group consisting of graphene, tin(IV) oxide, zinc oxide, Tris (2,4,6-trimethyl-3-(pyridin-3-yl)phenyl)borane, 4,6-Bis(3,5-di(pyridin-3-yl)phenyl)-2-methylpyrimidine, 1,3-Bis(3,5-dipyrid-3-ylphenyl)benzene, 2,7-Bis(2,2'-bipyridin-5-yl)triphenylene, Lithium 8-quinolinolate, Poly[(9,9-bis(3'-((N,N-dimethyl)-N-ethylammonium)-propyl)-2,7-fluorene)-alt-2,7-(9, 9-dioctylfluorene)]dibromide, Poly[(9,9-bis(3'-(N,N-dimethylamino)propyl)-2,7-fluorene)-alt-2,7-(9,9-dioctylfluorene)], (1,3, 5-Triazine-2,4,6-triyl)tris(benzene-3,1-diyl)tris (diphenylphosphine oxide), 2,5,8,11-Tetrakis(1,1-dimethylethyl)perylene, 1,3,5-Tris(3-pyridyl-3-phenyl) benzene, 1,3,5-Tris(1-phenyl-1H-benzimidazol-2-yl) benzene, Diphenyl[4-(triphenylsilyl)phenyl]phosphine oxide, 3,5-Diphenyl-4-(1-naphthyl)-1H-1,2,4-triazole, Tris(8-hydroxyquinoline)aluminum, 2,9-Dimethyl-4,7-diphenyl-1,10-phenanthroline, 4,7-Diphenyl-1,10-phenanthroline, 2,5-Bis(1-naphthyl)-1,3,4-oxadiazole, Bis(8-hydroxy-2-methylquinoline)-(4-phenylphenoxy) aluminum, 3,5-Bis(4-tert-butylphenyl)-4-phenyl-4H-1, 2,4-triazole, 2-(4-Biphenylyl)-5-phenyl-1,3,4-oxadiazole, 3-(Biphenyl-4-yl)-5-(4-tert-butylphenyl)-4-phenyl-4H-1,2,4-triazole, and 2-(4-tert-butylphenyl)-5-(4-biphenylyl)-1,3,4-oxadiazole.

5. The display device according to claim 1,
wherein the adjacent pixel electron blocking section is made of an organic insulating material.

6. The display device according to claim 5,
wherein the organic insulating material is at least one resin selected from the group consisting of polyimide, polyetherimide, polyacrylonitrile, polyetheretherketone, polyvinyl alcohol, polyisoprene, novolac resin, and polyacrylamide.

7. The display device according to claim 1,
wherein the adjacent pixel electron blocking section is made of a hole transport material.

8. The display device according to claim 7,
wherein the hole transport material is at least one hole transport material selected from the group consisting of graphene oxide, copper thiocyanate, tungsten oxide, 2,6-Bis(9H-carbazol-9-yl)pyridine, 4,4'-Bis(3-ethyl-N-carbazolyl)-1,1'-biphenyl, 4-(Dibenzylamino)benzaldehyde-N,N'-diphenylhydrazone, 9,9'-[2,2'-Dimethyl (1,1'-biphenyl)-4,4'-diyl]bis-9H-carbazole, 2,2'-Dimethyl-N,N'-di(1-naphthyl-N,N'-diphenyl)-1,1'-biphenyl-4,4'-diamine, 9,9'-Dimethyl-N,N'-di(1-naphthyl)-N,N'-diphenyl-9H-fluorene-2,7-diamine, N,N'-Di(2-naphthyl-N,N'-diphenyl)-1,1'-biphenyl-4,4'-diamine, N,N'-Diphenyl-N,N'-bis[4-(phenyl-m-tolylamino)phenyl]biphenyl-4,4'-diamine, N,N'-Diphenyl-N,N'-di-p-tolylbenzene-1,4-diamine, N,N'-Di(1-naphthyl)-N,N'-diphenyl-1,1'-biphenyl-4,4'-diamine, N4,N4'-Bis{4-[bis(3-methylphenyl)amino]phenyl}-N4,N4'-diphenyl-(1,1'-biphenyl)-4, 4'-diamine, 3-(4,6-Diphenyl-1,3,5-triazin-2-yl)-9-phenyl-9H-carbazole, 9-(2-Ethylhexyl)-N,N,N,N-tetrakis(4-methoxyphenyl)-9H-carbazole-2,7-diamine, Indium(III) phthalocyanine chloride, Poly[N,N'-bis(4-butylphenyl)-N,N'-bis(phenyl)-benzidine], 2,8-Bis(diphenylphosphine oxide)dibenzofuran, 4,4',4'',4'''-Silanetetrayltetrakis(N, N-bis(4-methoxyphenyl)aniline, Spiro[9H-fluorene-9, 9'-(9H)xanthine]-2,7-diamine, Spiro[9H-fluorene-9,9'-(9H)xanthine]-2,2',7,7'-tetramine, 2,4,6-Tris[3-(carbazole-9-yl)phenyl]triazine, N,N,N',N'-Tetrakis(4-methoxyphenyl)benzidine, N,N,N',N'-Tetrakis(3-methylphenyl)-3,3'-dimethylbenzidine, N,N,N',N'-Tetrakis(2-naphthyl)benzidine, Tetra-N-phenylbenzidine, N,N,N',N'-Tetraphenylnaphthalene-2,6-diamine, Poly[(9,9-dioctylfluorenyl-2,7-diyl)-co-{4,4'-[N-(4-sec-butylphenyl)diphenylamine]}, Titanyl phthalocyanine, 1,3,5-Tris[(3-methylphenyl)phenylamino]benzene, 4,4',4''-Tris[2-naphthyl(phenyl) amino]triphenylamine, Vanadyl phthalocyanine, 4,4'-Cyclohexylidenebis[N,N-bis(4-methylphenyl) benzenamine], Dipyrazino[2,3-f:2',3'-h]quinoxaline-2, 3,6,7,10,11-hexacarbonitrile, Tin(IV)2,3-naphthalocyanine dichloride, N2,N2,N2',N2',N7,N7, N7',N7'-Octakis(4-methoxyphenyl)-9,9'-spirobi[9H-fluorene]-2, 2',7,7'-tetramine, Titanyl phthalocyanine, 1,3,5-Tris(2-(9-ethylcarbazyl-3)ethylene)benzene, Tris (4-carbazoyl-9-ylphenyl)amine, Tris[4-(diethylamino) phenyl]amine, 1,3,5-Tris(diphenylamino)benzene, 4,4', 4''-Tris[phenyl(m-tolyl)amino]triphenylamine, 4,4'-Bis (N-carbazolyl)-1,1'-biphenyl, 1,3-Bis(N-carbazolyl) benzene, 1,4-Bis(N-carbazolyl)benzene, N,N'-Bis(3-methylphenyl)-N,N'-diphenylbenzidine, Poly(N-ethyl-2-vinylcarbazole), Poly[bis(4-phenyl)(2,4,6-trimethylphenyl)amine], Poly(9-vinylcarbazole), Poly (1-vinylnaphthalene), Poly(2-vinylnaphthalene), Poly (copper phthalocyanine), and Copper(II) phthalocyanine.

9. A display device having a plurality of pixels, the display device comprising:
a support body;
a thin film transistor layer;
a light-emitting element layer; and
a sealing layer configured to seal the light-emitting element layer in this order,
wherein the light-emitting element layer includes a plurality of light-emitting elements having different luminescent colors from each other,
the plurality of light-emitting elements is formed, such that each of the plurality of light-emitting elements corresponds to a respective pixel in the plurality of pixels,
each of the plurality of light-emitting elements includes a lower electrode, an upper electrode, and a light-emitting layer formed between the lower electrode and the upper electrode, and a first carrier transport layer formed between the light-emitting layer and the lower electrode,
the lower electrode and the light-emitting layer are formed in island shapes for each of the plurality of pixels,
the first carrier transport layer included in the light-emitting element is a common layer formed in common to the plurality of light-emitting elements in the plurality of pixels,
the first carrier transport layer includes, for each of the plurality of pixels, a carrier transport section formed overlapping the light-emitting layer in each of the plurality of light-emitting elements and configured to transport carriers to the light-emitting layer, and an adjacent pixel carrier blocking section formed in a portion between the plurality of light-emitting elements in the plurality of pixels adjacent to each other and configured to block transportation of the carriers between the plurality of light-emitting elements in the plurality of pixels adjacent to each other,
the lower electrode is a cathode electrode,
the upper electrode is an anode electrode,
the first carrier transport layer is an electron transport layer, and
the adjacent pixel carrier blocking section of the first carrier transport layer is an adjacent pixel electron blocking section configured to block transportation of electrons between the plurality of light-emitting elements in the plurality of pixels adjacent to each other, and is made of a hole transport material.

10. The display device according to claim 9,
wherein the carrier transport section of the first carrier transport layer is an electron transport section and is made of at least one electron transport material selected from the group consisting of graphene, tin(IV) oxide, zinc oxide, Tris(2,4,6-trimethyl-3-(pyridin-3-yl)phenyl)borane, 4,6-Bis(3,5-di(pyridin-3-yl)phenyl)-2-methylpyrimidine, 1,3-Bis(3,5-dipyrid-3-ylphenyl) benzene, 2,7-Bis(2,2'-bipyridin-5-yl)triphenylene, Lithium 8-quinolinolate, Poly[(9,9-bis(3'-((N,N-dimethyl)-N-ethylammonium)-propyl)-2,7-fluorene)-alt-2, 7-(9, 9-dioctylfluorene)]dibromide, Poly[(9,9-bis(3'-(N,N-dimethylamino)propyl)-2,7-fluorene)-alt-2,7-(9, 9-dioctylfluorene)], (1,3,5-Triazine-2,4,6-triyl)tris (benzene-3,1-diyl)tris(diphenylphosphine oxide), 2,5, 8,11-Tetrakis(1,1-dimethylethyl)perylene, 1,3,5-Tris (3-pyridyl-3-phenyl)benzene, 1,3,5-Tris(1-phenyl-1H-benzimidazol-2-yl)benzene, Diphenyl[4-(triphenylsilyl)phenyl]phosphine oxide, 3,5-Diphenyl-4-(1-naphthyl)-1H-1,2,4-triazole, Tris(8-hydroxyquinoline)aluminum, 2,9-Dimethyl-4,7-diphenyl-1,10-phenanthroline, 4,7-Diphenyl-1,10-phenanthroline, 2,5-Bis(1-naphthyl)-1,3,4-oxadiazole, Bis(8-hydroxy-2-methylquinoline)-(4-phenylphenoxy) aluminum, 3,5-Bis(4-tert-butylphenyl)-4-phenyl-4H-1, 2,4-triazole, 2-(4-Biphenylyl)-5-phenyl-1,3,4-oxadiazole, 3-(Biphenyl-4-yl)-5-(4-tert-butylphenyl)-4-phenyl-4H-1,2,4-triazole, and 2-(4-tert-butylphenyl)-5-(4-biphenylyl)-1,3,4-oxadiazole.

11. The display device according to claim 9,
wherein the hole transport material is at least one hole transport material selected from the group consisting of graphene oxide, copper thiocyanate, tungsten oxide, 2,6-Bis(9H-carbazol-9-yl)pyridine, 4,4'-Bis(3-ethyl-N-carbazolyl)-1,1'-biphenyl, 4-(Dibenzylamino)benzaldehyde-N,N'-diphenylhydrazone, 9,9'-[2,2'-Dimethyl (1,1'-biphenyl)-4,4'-diyl]bis-9H-carbazole, 2,2'-Dimethyl-N,N'-di(1-naphthyl-N,N'-diphenyl)-1,1'-biphenyl-4,4'-diamine, 9,9'-Dimethyl-N,N'-di(1-naphthyl)-N,N'-diphenyl-9H-fluorene-2,7-diamine, N,N'-Di(2-naphthyl-N,N'-diphenyl)-1,1'-biphenyl-4,4'-diamine, N,N'-Diphenyl-N,N'-bis[4-(phenyl-m-tolylamino)phenyl]biphenyl-4,4'-diamine, N,N'-Diphenyl-N,N'-di-p-tolylbenzene-1,4-diamine, N,N'-Di(1-naphthyl)-N,N'-diphenyl-1,1'-biphenyl-4,4'-diamine, N4,N4'-Bis{4-[bis(3-methylphenyl)amino]phenyl}-N4,N4'-diphenyl-(1,1'-biphenyl)-4, 4'-diamine, 3-(4,6-Diphenyl-1,3,5-triazin-2-yl)-9-phenyl-9H-carbazole, 9-(2-Ethylhexyl)-N,N,N,N-tetrakis(4-methoxyphenyl)-9H-carbazole-2,7-diamine, Indium(III) phthalocyanine chloride, Poly[N,N'-bis(4-butylphenyl)-N,N'-bis(phenyl)-benzidine], 2,8-Bis(diphenylphosphine oxide)dibenzofuran, 4,4',4'',4'''-Silanetetrayltetrakis(N, N-bis(4-methoxyphenyl)aniline, Spiro[9H-fluorene-9, 9'-(9H)xanthine]-2,7-diamine, Spiro[9H-fluorene-9,9'-(9H)xanthine]-2,2',7,7'-tetramine, 2,4,6-Tris[3-(carbazole-9-yl)phenyl]triazine, N,N,N',N'-Tetrakis(4-methoxyphenyl)benzidine, N,N,N',N'-Tetrakis(3-methylphenyl)-3,3'-dimethylbenzidine, N,N,N',N'-Tetrakis(2-naphthyl)benzidine, Tetra-N-phenylbenzidine, N,N,N',N'-Tetraphenylnaphthalene-2,6-diamine, Poly[(9,9-dioctylfluorenyl-2,7-diyl)-co-{4,4'-[N-(4-sec-butylphenyl)diphenylamine]}, Titanyl phthalocyanine, 1,3,5-Tris[(3-methylphenyl)phenylamino]benzene, 4,4',4''-Tris[2-naphthyl(phenyl) amino]triphenylamine, Vanadyl phthalocyanine, 4,4'-Cyclohexylidenebis[N,N-bis(4-methylphenyl) benzenamine], Dipyrazino[2,3-f:2',3'-h]quinoxaline-2, 3,6,7,10,11-hexacarbonitrile, Tin(IV)2,3-naphthalocyanine dichloride, N2,N2,N2',N2',N7,N7, N7',N7'-Octakis(4-methoxyphenyl)-9,9'-spirobi[9H-fluorene]-2, 2',7,7'-tetramine, Titanyl phthalocyanine, 1,3,5-Tris(2-(9-ethylcarbazyl-3)ethylene)benzene, Tris (4-carbazoyl-9-ylphenyl)amine, Tris[4-(diethylamino) phenyl]amine, 1,3,5-Tris(diphenylamino)benzene, 4,4', 4''-Tris[phenyl(m-tolyl)amino]triphenylamine, 4,4'-Bis (N-carbazolyl)-1,1'-biphenyl, 1,3-Bis(N-carbazolyl) benzene, 1,4-Bis(N-carbazolyl)benzene, N,N'-Bis(3-methylphenyl)-N,N'-diphenylbenzidine, Poly(N-ethyl-2-vinylcarbazole), Poly[bis(4-phenyl)(2,4,6-trimethylphenyl)amine], Poly(9-vinylcarbazole), Poly (1-vinylnaphthalene), Poly(2-vinylnaphthalene), Poly (copper phthalocyanine), and Copper(II) phthalocyanine.

12. A display device having a plurality of pixels, the display device comprising:
a support body;
a thin film transistor layer;
a light-emitting element layer; and
a sealing layer configured to seal the light-emitting element layer in this order,
wherein the light-emitting element layer includes a plurality of light-emitting elements having different luminescent colors from each other,
the plurality of light-emitting elements is formed, such that each of the plurality of light-emitting elements corresponds to a respective pixel in the plurality of pixels,
each of the plurality of light-emitting elements includes a lower electrode, an upper electrode, a light-emitting layer formed between the lower electrode and the upper electrode, a first carrier transport layer formed between the light-emitting layer and the lower electrode, and a second carrier transport layer formed between the light-emitting layer and the upper electrode,
the lower electrode and the light-emitting layer are formed in island shapes for each of the plurality of pixels,
at least the first carrier transport layer of the first and second carrier transport layers included in the light-emitting element is a common layer formed in common to the plurality of light-emitting elements in the plurality of pixels,
the at least the first carrier transport layer includes, for each of the plurality of pixels, a carrier transport section formed overlapping the light-emitting layer in each of the plurality of light-emitting elements and configured to transport carriers to the light-emitting layer, and an adjacent pixel carrier blocking section formed in a portion between the plurality of light-emitting elements in the plurality of pixels adjacent to each other and configured to block transportation of the carriers between the plurality of light-emitting elements in the plurality of pixels adjacent to each other,
the lower electrode is a cathode electrode,
the upper electrode is an anode electrode,
the first carrier transport layer is an electron transport layer,
the second carrier transport layer is a hole transport layer, and the hole transport layer is another common layer formed in common to the plurality of light-emitting elements in the plurality of pixels, and
the hole transport layer includes, for each of the plurality of pixels:
a hole transport section formed overlapping the light-emitting layer in each of the plurality of light-emitting elements and configured to transport positive holes to the light-emitting layer, and an adjacent pixel hole blocking section formed in a portion between the plurality of light-emitting elements in the plurality of pixels adjacent to each other and configured to block transportation of the positive holes between the plurality of light-emitting elements in the plurality of pixels adjacent to each other.

13. The display device according to claim 12,
wherein the hole transport section is made of at least one hole transport material selected from the group consisting of graphene oxide, copper thiocyanate, tungsten oxide, 2,6-Bis(9H-carbazol-9-yl)pyridine, 4,4'-Bis(3-ethyl-N-carbazolyl)-1,1'-biphenyl, 4-(Dibenzylamino)benzaldehyde-N,N'-diphenylhydrazone, 9,9'-[2,2'-Dimethyl(1,1'-biphenyl)-4,4'-diyl]bis-9H-carbazole, 2,2'-Dimethyl-N,N'-di(1-naphthyl-N,N'-diphenyl)-1,1'-biphenyl-4,4'-diamine, 9,9'-Dimethyl-N,N'-di(1-naphthyl)-N,N'-diphenyl-9H-fluorene-2,7-diamine, N,N'-Di(2-naphthyl-N,N'-diphenyl)-1,1'-biphenyl-4,4'-diamine, N,N'-Diphenyl-N,N'-bis[4-(phenyl-m-tolylamino)phenyl]biphenyl-4,4'-diamine, N,N'-Diphenyl-N,N'-di-p-tolylbenzene-1,4-diamine, N,N'-Di(1-naphthyl)-N,N'-diphenyl-1,1'-biphenyl-4,4'-diamine, N4,N4'-Bis{4-[bis(3-methylphenyl)amino]phenyl}-N4,N4'-diphenyl-(1,1'-biphenyl)-4, 4'-diamine, 3-(4,6-Diphenyl-1,3,5-triazin-2-yl)-9-phenyl-9H-carbazole, 9-(2-Ethylhexyl)-N,N,N,N-tetrakis(4-methoxyphenyl)-9H-carbazole-2,7-diamine, Indium(III) phthalocyanine chloride, Poly[N,N'-bis(4-butylphenyl)-N,N'-bis(phenyl)-benzidine], 2,8-Bis(diphenylphosphine oxide)dibenzofuran, 4,4',4'',4'''-Silanetetrayltetrakis(N,N-bis(4-methoxyphenyl)aniline, Spiro[9H-fluorene-9,9'-(9H)xanthine]-2,7-diamine, Spiro[9H-fluorene-9,9'-(9H)xanthine]-2,2',7,7'-tetramine, 2,4,6-Tris[3-(carbazole-9-yl)phenyl]triazine, N,N,N',N'-Tetrakis(4-methoxyphenyl)benzidine, N,N,N',N'-Tetrakis(3-methylphenyl)-3,3'-dimethylbenzidine, N,N,N',N'-Tetrakis(2-naphthyl)benzidine, Tetra-N-phenylbenzidine, N,N,N',N'-Tetraphenylnaphthalene-2,6-diamine, Poly[(9,9-dioctylfluorenyl-2,7-diyl)-co-{4,4'-[N-(4-sec-butylphenyl)diphenylamine]}, Titanyl phthalocyanine, 1,3,5-Tris[(3-methylphenyl)phenylamino]benzene, 4,4',4''-Tris[2-naphthyl(phenyl)amino]triphenylamine, Vanadyl phthalocyanine, 4,4'-Cyclohexylidenebis[N,N-bis(4-methylphenyl)benzenamine], Dipyrazino[2,3-f:2',3'-h]quinoxaline-2,3,6,7,10,11-hexacarbonitrile, Tin(IV)2,3-naphthalocyanine dichloride, N2,N2,N2',N2',N7,N7,N7',N7'-Octakis(4-methoxyphenyl)-9,9'-spirobi[9H-fluorene]-2, 2',7,7'-tetramine, Titanyl phthalocyanine, 1,3,5-Tris(2-(9-ethylcarbazyl-3)ethylene)benzene, Tris(4-carbazoyl-9-ylphenyl)amine, Tris[4-(diethylamino)phenyl]amine, 1,3,5-Tris(diphenylamino)benzene, 4,4',4''-Tris[phenyl(m-tolyl)amino]triphenylamine, 4,4'-Bis(N-carbazolyl)-1,1'-biphenyl, 1,3-Bis(N-carbazolyl)benzene, 1,4-Bis(N-carbazolyl)benzene, N,N'-Bis(3-methylphenyl)-N,N'-diphenylbenzidine, Poly(N-ethyl-2-vinylcarbazole), Poly[bis(4-phenyl)(2,4,6-trimethylphenyl)amine], Poly(9-vinylcarbazole), Poly(1-vinylnaphthalene), Poly(2-vinylnaphthalene), Poly(copper phthalocyanine), and Copper(II) phthalocyanine.

14. The display device according to claim 12,
wherein the adjacent pixel hole blocking section is made of an organic insulating material.

15. The display device according to claim 14,
wherein the organic insulating material is at least one resin selected from the group consisting of polyimide, polyetherimide, polyacrylonitrile, polyetheretherketone, polyvinyl alcohol, polyisoprene, novolac resin, and polyacrylamide.

16. The display device according to claim 12,
wherein the adjacent pixel hole blocking section is made of an electron transport material.

17. The display device according to claim 16,
wherein the electron transport material is at least one electron transport material selected from the group consisting of graphene, tin(IV) oxide, zinc oxide, Tris(2,4,6-trimethyl-3-(pyridin-3-yl)phenyl)borane, 4,6-Bis(3,5-di(pyridin-3-yl)phenyl)-2-methylpyrimidine, 1,3-Bis(3,5-dipyrid-3-ylphenyl)benzene, 2,7-Bis(2,2'-bipyridin-5-yl)triphenylene, Lithium 8-quinolinolate, Poly[(9,9-bis(3'-((N,N-dimethyl)-N-ethylammonium)-propyl)-2,7-fluorene)-alt-2,7-(9, 9-dioctylfluorene)]dibromide, Poly[(9,9-bis(3'-(N,N-dimethylamino)propyl)-2,7-fluorene)-alt-2,7-(9,9-dioctylfluorene)], (1,3,5-Triazine-2,4,6-triyl)tris(benzene-3,1-diyl)tris(diphenylphosphine oxide), 2,5,8,11-Tetrakis(1,1-dimethylethyl)perylene, 1,3,5-Tris(3-pyridyl-3-phenyl)benzene, 1,3,5-Tris(1-phenyl-1H-benzimidazol-2-yl)benzene, Diphenyl[4-(triphenylsilyl)phenyl]phosphine oxide, 3,5-Diphenyl-4-(1-naphthyl)-1H-1,2,4-triazole, Tris(8-hydroxyquinoline)aluminum, 2,9-Dimethyl-4,7-diphenyl-1,10-phenanthroline, 4,7-Diphenyl-1,10-phenanthroline, 2,5-Bis(1-naphthyl)-1,3,4-oxadiazole, Bis(8-hydroxy-2-methylquinoline)-(4-phenylphenoxy)aluminum, 3,5-Bis(4-tert-butylphenyl)-4-phenyl-4H-1,2,4-triazole, 2-(4-Biphenylyl)-5-phenyl-1,3,4-oxadiazole, 3-(Biphenyl-4-yl)-5-(4-tert-butylphenyl)-4-phenyl-4H-1,2,4-triazole, and 2-(4-tert-butylphenyl)-5-(4-biphenylyl)-1,3,4-oxadiazole.

* * * * *